United States Patent
Chun et al.

(10) Patent No.: US 9,698,051 B2
(45) Date of Patent: Jul. 4, 2017

(54) SEMICONDUCTOR CHIPS HAVING THROUGH SILICON VIAS AND RELATED FABRICATION METHODS AND SEMICONDUCTOR PACKAGES

(71) Applicant: Samsung Electronics Co., Ltd., Suwon-si, Gyeonggi-do (KR)

(72) Inventors: Jin-ho Chun, Seoul (KR); Byung-Iyul Park, Seoul (KR); Hyun-soo Chung, Hwaseong-si (KR); Gil-heyun Choi, Seoul (KR); Son-kwan Hwang, Suwon-wi (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 14/590,036

(22) Filed: Jan. 6, 2015

(65) Prior Publication Data

US 2015/0111346 A1 Apr. 23, 2015

Related U.S. Application Data

(62) Division of application No. 13/733,923, filed on Jan. 4, 2013, now Pat. No. 8,957,526.

(30) Foreign Application Priority Data

Apr. 9, 2012 (KR) .................. 10-2012-0036798

(51) Int. Cl.
*H01L 23/52* (2006.01)
*H01L 23/48* (2006.01)
(Continued)

(52) U.S. Cl.
CPC ...... *H01L 21/76898* (2013.01); *H01L 21/768* (2013.01); *H01L 21/76841* (2013.01);
(Continued)

(58) Field of Classification Search
CPC ....... H01L 23/5226; H01L 2924/01078; H01L 2924/01079; H01L 23/481; H01L 2924/01029
USPC .......... 257/774, 737, 773, E23.068, E23.06; 438/627, 637, 127, 703
See application file for complete search history.

(56) References Cited

U.S. PATENT DOCUMENTS 6,132,546 A * 10/2000 Diaz .................. B29D 99/0089
156/197
7,528,476 B2 5/2009 Ito
(Continued)

FOREIGN PATENT DOCUMENTS

KR 1020100030024 A 3/2010

*Primary Examiner* — John C Ingham
*Assistant Examiner* — Didarul Mazumder
(74) *Attorney, Agent, or Firm* — Myers Bigel, P.A.

(57) ABSTRACT

A semiconductor chip including through silicon vias (TSVs), wherein the TSVs may be prevented from bending and the method of fabricating the semiconductor chip may be simplified, and a method of fabricating the semiconductor chip. The semiconductor chip includes a silicon substrate having a first surface and a second surface; a plurality of TSVs which penetrate the silicon substrate and protrude above the second surface of the silicon substrate; a polymer pattern layer which is formed on the second surface of the silicon substrate, surrounds side surfaces of the protruding portion of each of the TSVs, and comprises a flat first portion and a second portion protruding above the first portion; and a plated pad which is formed on the polymer pattern layer and covers a portion of each of the TSVs exposed from the polymer pattern layer.

19 Claims, 28 Drawing Sheets

(51) Int. Cl.
  *H01L 29/24* (2006.01)
  *H01L 21/768* (2006.01)
  *H01L 25/065* (2006.01)
  *H01L 23/544* (2006.01)
  *H01L 23/00* (2006.01)
  *H01L 23/31* (2006.01)

(52) U.S. Cl.
  CPC .......... *H01L 23/481* (2013.01); *H01L 23/544* (2013.01); *H01L 24/03* (2013.01); *H01L 24/81* (2013.01); *H01L 25/065* (2013.01); *H01L 25/0657* (2013.01); *H01L 23/3128* (2013.01); *H01L 2223/54426* (2013.01); *H01L 2224/03462* (2013.01); *H01L 2224/0401* (2013.01); *H01L 2224/05* (2013.01); *H01L 2224/05025* (2013.01); *H01L 2224/0557* (2013.01); *H01L 2224/06181* (2013.01); *H01L 2224/13* (2013.01); *H01L 2224/13023* (2013.01); *H01L 2224/16146* (2013.01); *H01L 2224/16225* (2013.01); *H01L 2224/32145* (2013.01); *H01L 2224/32225* (2013.01); *H01L 2224/73204* (2013.01); *H01L 2224/8185* (2013.01); *H01L 2924/00014* (2013.01); *H01L 2924/06* (2013.01); *H01L 2924/12042* (2013.01); *H01L 2924/15311* (2013.01); *H01L 2924/15788* (2013.01); *H01L 2924/181* (2013.01); *H01L 2924/18161* (2013.01)

(56) References Cited

U.S. PATENT DOCUMENTS

| | | | |
|---|---|---|---|
| 7,691,747 B2 | 4/2010 | Lin et al. | |
| 7,998,860 B2 | 8/2011 | Li et al. | |
| 8,298,944 B1 | 10/2012 | West | |
| 2002/0051943 A1* | 5/2002 | Tanaka | G03F 1/14 430/311 |
| 2002/0185671 A1* | 12/2002 | Kim | H01L 21/76807 257/301 |
| 2009/0202942 A1 | 8/2009 | Fukui et al. | |
| 2009/0278245 A1* | 11/2009 | Bonifield | H01L 23/481 257/676 |
| 2010/0038800 A1 | 2/2010 | Yoon et al. | |
| 2010/0096738 A1* | 4/2010 | Simmons-Matthews | H01L 21/76898 257/686 |
| 2010/0117201 A1* | 5/2010 | Ching | H01L 23/473 257/621 |
| 2010/0123256 A1 | 5/2010 | Yoda et al. | |
| 2010/0171226 A1 | 7/2010 | West et al. | |
| 2010/0221892 A1 | 9/2010 | Takao | |
| 2010/0276787 A1 | 11/2010 | Yu et al. | |
| 2010/0279463 A1 | 11/2010 | Hsiao et al. | |
| 2010/0302482 A1* | 12/2010 | Takahashi | G02B 5/201 349/106 |
| 2010/0330798 A1 | 12/2010 | Huang et al. | |
| 2011/0086296 A1* | 4/2011 | Moon | G03F 1/32 430/5 |
| 2011/0086486 A1 | 4/2011 | Lee et al. | |
| 2011/0140247 A1 | 6/2011 | Pagaila et al. | |
| 2011/0236806 A1* | 9/2011 | Ouye | G03F 1/80 430/5 |
| 2011/0241217 A1* | 10/2011 | Chang | H01L 21/6835 257/774 |
| 2011/0291246 A1* | 12/2011 | Jo | H01L 24/81 257/621 |
| 2012/0175774 A1 | 7/2012 | West et al. | |
| 2012/0306085 A1* | 12/2012 | West | H01L 23/481 257/762 |

* cited by examiner

SEMICONDUCTOR CHIPS HAVING THROUGH SILICON VIAS AND RELATED FABRICATION METHODS AND SEMICONDUCTOR PACKAGES

CROSS-REFERENCE TO RELATED APPLICATIONS

This application claims priority under 35 U.S.C. §120 to U.S. patent application Ser. No. 13/733,923, filed Jan. 4, 2013, which in turn claims priority under 35 U.S.C. §119 to Korean Patent Application No. 10-2012-0036798, filed on Apr. 9, 2012 in the Korean intellectual Property Office, the disclosure of each of which are incorporated herein in their entirety by reference.

BACKGROUND

The inventive concept relates to a semiconductor package, and more particularly, to semiconductor chips having through silicon vias ("TSVs") and to methods of fabricating such semiconductor chips.

Generally, a plurality of semiconductor chips are formed by subjecting a wafer to various semiconductor fabricating processes. After the semiconductor chips are formed, a packaging process may be performed to form semiconductor packages, and these semiconductor packages may then be mounted on a printed circuit board ("PCB"). Each semiconductor package may include a semiconductor chip, a PCB on which the semiconductor chip is mounted, a bonding wire or a bump for electrically connecting the semiconductor chip and the PCB to each other, and a sealant for sealing the semiconductor chip.

Recently, semiconductor packages in which semiconductor chips are stacked by using TSVs have been developed. In such semiconductor packages, high reliability of the adhesion between the semiconductor chips may be desirable.

SUMMARY

The inventive concept provides a semiconductor chip including through silicon vias (TSVs). In some aspects, the TSVs may be less susceptible to bending or breaking. Methods of fabricating these semiconductor chips are also disclosed which may be simpler than prior art methods of forming semiconductor chips having TSVs.

According to an aspect of the inventive concept, there is provided a semiconductor chip including a silicon substrate having a first surface and a second surface; a plurality of TSVs which penetrate the silicon substrate and protrude above the second surface of the silicon substrate; a polymer pattern layer which is formed on the second surface of the silicon substrate, surrounds side surfaces of the protruding portion of each of the TSVs, and includes a flat first portion and a second portion protruding above the first portion; and a plated pad which is formed on the polymer pattern layer and covers a portion of each of the TSVs exposed from the polymer pattern layer.

A height of the top surface of the protruding portion of each of the TSVs is greater than that of the first portion and lower than or equal to that of the second portion. The first portion is formed in a half-exposed region formed by using a phase shift mask (PSM), and the TSVs protrude from the first portion. The second portion is formed in an unexposed region formed by using the PSM.

The polymer pattern layer includes the second portion protruding upward between the TSVs or the first portion having a uniform thickness between the TSVs.

According to another aspect of the inventive concept, there is provided a semiconductor package including a package substrate; at least one semiconductor chip of claim 1 which includes a plurality of through silicon vias (TSVs) and is mounted on the package substrate; and a sealant which seals the semiconductor chip.

Two or more semiconductor chips are stacked on the package substrate, and the semiconductor chips are stacked by using an adhesive or an under-fill.

According to another aspect of the inventive concept, there is provided a method of fabricating a semiconductor chip, the method including recessing a second surface of a substrate on which a plurality of through silicon vias (TSV) is formed, such that the TSVs protrude above the second surface of the substrate; forming a polymer buffer layer covering the TSVs protruding above the second surface of the substrate; forming a polymer pattern layer including a completely-exposed region and a half-exposed region via an exposure process using a phase shift mask (PSM) with respect to the polymer buffer layer; and forming a plated pad on the TSVs via an electroplating process.

The method further includes curing the polymer pattern layer after the polymer pattern layer is formed. An insulation layer is formed on the top surface and the side surfaces of the TSVs, and a portion of the insulation layer on the protruding portion of the TSVs is removed before the electroplating process is performed.

The TSVs protrude above the half-exposed region, an alignment mark is formed in the completely-exposed region, and the completely-exposed region corresponds to a scribe lane (S/L).

The method further includes forming a barrier metal on the whole surface of the substrate before the plated pad is formed on the TSVs; forming a photoresist pattern covering a portion on which the plated pad is to be formed; and etching the barrier metal by using the photoresist pattern as a mask.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
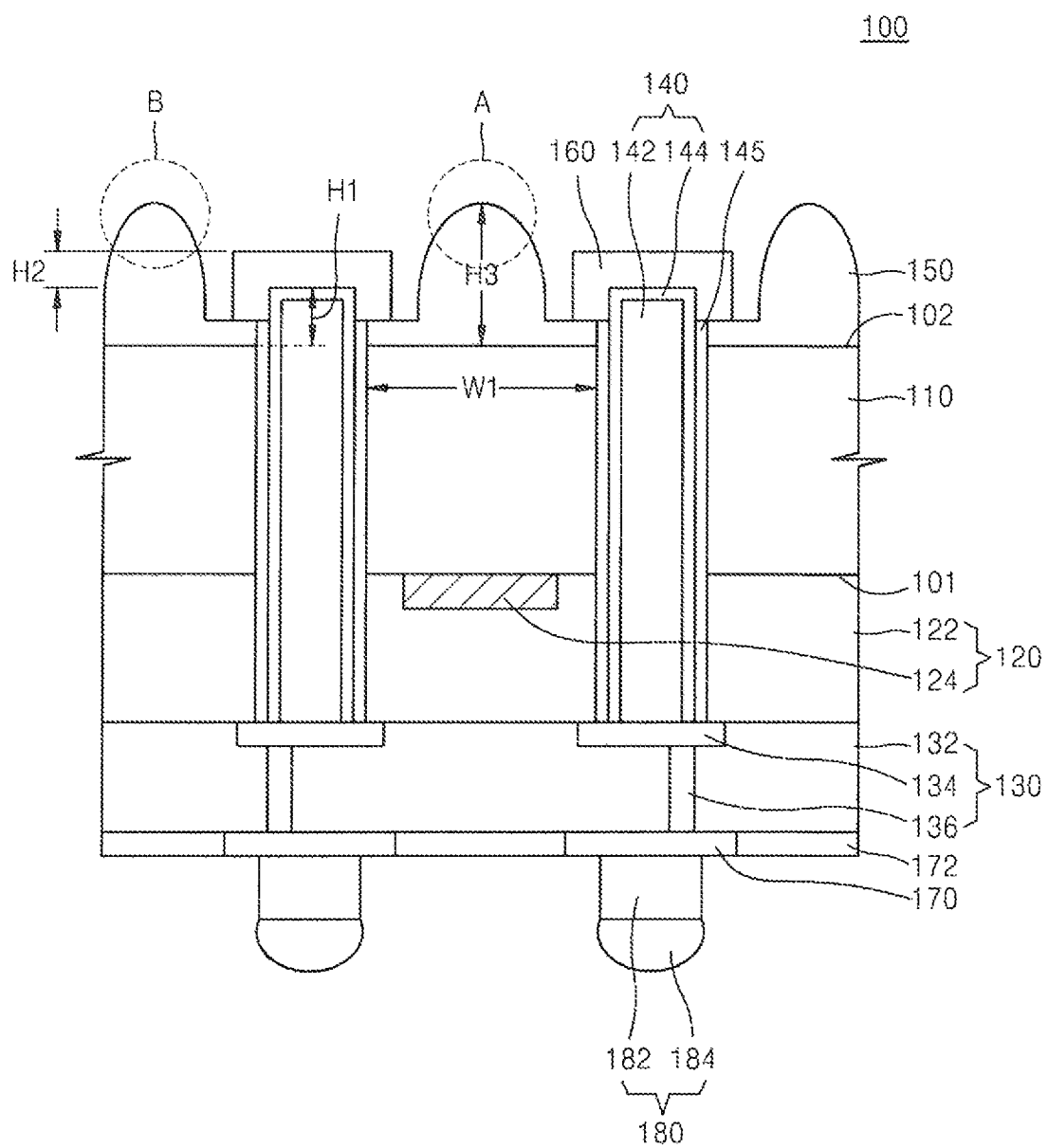
FIG. 1 is a sectional view of a semiconductor chip having a TSV according to an embodiment of the inventive concept.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will filly convey the concept of the invention to those skilled in the art.

It will be understood that when an element or layer is referred to as being "on" another element or layer, the element or layer can be directly on another element or layer or intervening elements or layers may be present. In contrast, when an element is referred to as being "directly Oil" another element or layer, there are no intervening elements or layers present. Like numbers refer to like elements throughout. As used herein, the term "and/or" includes any and all combinations of one or more of the associated listed items. In the drawings, the thicknesses of layers and regions are exaggerated for clarity. Like reference numerals in the drawings denote like elements, and thus their description will be omitted. For the purposes of promoting an understanding of the principles of the invention, reference has been made to the embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

FIG. 1 is a sectional view of a semiconductor chip 100 having a through silicon via (TSV) according to an embodiment of the inventive concept.

Referring to FIG. 1, the semiconductor chip 100 according to the present embodiment may include a semiconductor substrate 110, a circuit layer 120, a wiring layer 130, a plurality of TSVs 140, a polymer pattern layer 150, and a plated pad 160.

The semiconductor substrate 110 may be a semiconductor wafer. For example, the semiconductor substrate 110 may contain a group IV material or a group III-V compound. In some embodiments, the semiconductor substrate 110 may be a monocrystalline wafer. However, the semiconductor substrate 110 is not limited to a monocrystalline wafer, and any of various wafers, such as an epi or epitaxial wafer, a polished wafer, an annealed wafer, a silicon-on-insulator (SOI) wafer, etc., may be used as the semiconductor substrate 110. An epitaxial wafer is a wafer formed by growing a crystalline material on a monocrystalline substrate.

The semiconductor substrate 110 may include a first surface 101 and a second surface 102. The circuit layer 120 may be formed on the first surface 101 of the semiconductor substrate 110. Regions doped with impurities may be formed in the lower portion of the semiconductor substrate 110 close to the first surface 101 on which the circuit layer 120 is formed. The upper portion of the semiconductor substrate 110 that is close to the second surface 102 may be undoped. A circuit layer may be formed inside the semiconductor substrate 110. The first surface 101 of the semiconductor substrate 110 may be referred to as an active surface, whereas the second surface 102 of the semiconductor substrate 110 may be referred to as an inactive surface.

The circuit layer 120 may include an interlayer insulation layer 122 and an integrated circuit (IC) unit 124.

The interlayer insulation layer 122 may be formed to cover the IC unit 124 on the first surface 101. The interlayer insulation layer 122 may electrically isolate circuit devices in the IC unit 124 from each other. Furthermore, the interlayer insulation layer 122 may separate multi-layer wirings in the wiring layer 130 and the circuit devices in the IC unit 124 from each other. The interlayer insulation layer 122 may include a single layer or stacked layers selected from, for example, oxide layers, nitride layers, low-k dielectric layers, and high-k dielectric layers.

The IC unit 124 may be formed in the interlayer insulation layer 122 on the first surface 101 of the semiconductor substrate 110 and may include a plurality of circuit devices. According to the type of the semiconductor device 100, the IC unit 124 may include various circuit devices, e.g., transistors and/or capacitors. According to the structure of the IC unit 124, the semiconductor device 100 may function as a memory device or a logic device. For example, the memory device may be a DRAM, a SRAM, a flash memory, an EEPROM, a PRAM, a MRAM, and a RRAM. Structures of such semiconductor devices are generally known in the art and do not limit the scope of the inventive concept.

Although not shown, the circuit devices in the IC unit 124 may be electrically connected to multi-layer wirings in the wiring layer 130 via a conductive material layer, such as a via contact.

The wiring layer 130 may include an intermetal insulation layer 132, a wiring 134, and a vertical plug 136.

The intermetal insulation layer 132 is formed on the circuit layer 120, more particularly, on the interlayer insulation layer 122 to cover the wiring 134. The intermetal insulation layer 132 may electrically isolate two or more wirings from each other. Although the intermetal insulation layer 132 has a single layer structure, the intermetal insulation layer 132 may also be formed in a multiple layer structure, wherein the number of layers in the interracial insulation layers 132 may correspond to a number of layers in which the wirings 134 are formed.

The wiring 134 may include at least one layer and may constitute a predetermined circuit by being connected to circuit devices in the IC unit 124 or may be used for electrically connecting the circuit devices in the IC unit 124 to an external device. Although only a single layer wiring, e.g., a first wiring 134, is illustrated in the present embodiment, a second wiring, a third wiring, and so on may be formed on layers different from the layer on which the first wiring 134 is formed, and the second wiring, the third wiring, and so on may be connected to the first wiring 134 via vertical plugs. Furthermore, the first wiring 134 may be connected to an electrode pad 170 via the vertical plug 136. The first wiring 134 may be formed of a metal, such as copper, aluminium, tungsten, etc.

The present embodiment is not limited to the wirings and materials described above. Furthermore, structures or connection relationships between wirings and vertical plugs shown in FIG. 1 are merely examples, and structures or connection relationships between wirings 134 and vertical plugs 136 of the semiconductor device 100 according to the inventive concept are not limited to those shown in FIG. 1.

The wiring 134 and the vertical plug 136 may be formed of the same or different materials. The wiring 134 and the vertical plug 136 may each contain not only an inner metal constituting a wiring, but also at least one bather metal layer surrounding the inner metal.

The TSV 140 is formed to penetrate through the circuit layer 120, the semiconductor substrate 110, and the polymer pattern layer 150. The top end of the portion of the TSV 140 that protrudes above the polymer pattern layer 150 may be exposed. The height H1 of the portion of the TSV 140 that protrudes above the second surface 102 of the semiconductor substrate 110 may be from, for example, several to dozens of microns. For example, the protruding height H1 of the TSV 140 may be from about 6 µm to about 7 µm. In other embodiments, the protruding height H1 of the TSV 140 may be from about 1 µm to about 2 µm. Other heights H1 may be used.

As shown in FIG. 1, side surfaces of a at least part of the upper portion of each of the TSVs 140 are surrounded by the polymer pattern layer 150. As will be discussed in more detail herein, by forming the polymer pattern layer 150, a chemical mechanical polishing ("CMP") process may be omitted. Such a CMP process may damage or even break the TSVs 140. In some embodiments, if the protruding height H1 of each of the TSVs 140 is from about 6 µm to about 7 µm, side surfaces of each of the TSVs 140 may be surrounded by (see FIG. 1) the polymer pattern layer 150 having a thickness T1 from about 2 µm to about 3 µm (i.e., the TSVs 140 protrude above the top surface of the polymer pattern layer 150). As another example, in embodiments where the protruding height H1 of each of the TSVs 140 is from about 1 µm to about 2 µm, side surfaces of each of the TSVs 140 may be surrounded by a polymer pattern layer 150 having a thickness equal to or smaller than 1 µm or may not be surrounded at all.

Each of the TSVs 140 may contain at least one metal. For example, each of the TSVs 140 may include a wiring metal layer 142 at the center thereof and a barrier metal layer 144 surrounding the wiring metal layer 142. The wiring metal layer 142 may contain one or more from among aluminium (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr) or alloys thereof. For example, the wiring metal layer 142 may have a stacked structure in which one or more layers formed of W, Al, or Cu are stacked. Meanwhile, the barrier metal layer 144 may have a stacked structure in which one or more layers formed of Ti, Ta, titanium nitride (TiN), or tantalum nitride TaN are stacked. However, materials for the wiring metal layer 142 and the barrier metal layer 144 are not limited thereto. In some embodiments, the barrier metal layer 144 may be omitted. It will be appreciated that a TSV 140 need not include silicon, nor does a TSV 140 necessarily have to extend through a silicon substrate. For example, in other embodiments, a TSV may extend through a germanium substrate or a III-V semiconductor substrate.

As noted above, a plated pad 160 may be formed on the top surface and the side surfaces of each of the TSVs 140. The plated pad 160 may be formed of, for example, Au, Ni/Au or Ni/Pd/Au. The plated pad 160 may be formed by electroplating each of the TSVs 140 or by forming a seed metal layer on each of the TSVs 140 and then forming the plated pad 160 on the seed metal layer. The plated pad 160 may be formed to have a thickness of several microns. For example, the thickness H2 of the plated pad 160 from the top surface of the TSVs 140 may be from about 1 µm to about 3 µm. Although the side surfaces of the plated pad 160 are shown to be spaced apart from protrusions A and B of the polymer pattern layer 150, in other embodiments the side surfaces of the plated pad 160 may contact the protrusions A and/or B of the polymer pattern layer 150.

Organic solderable preservatives (OSP) may be treated on and/or into the top surface of the TSV 140. Furthermore, instead of the plated pad 160, a capping metal layer may be formed on the top surface of the TSV 140 via a surface treatment, such as direct immersion gold (DIG), electroless nickel immersion gold (ENIG), electroless nickel electroless palladium immersion gold (ENEPIG), etc. The TSV 140 may be more firmly attached to a bump or a solder ball through the surface treatment.

A spacer insulation layer 145 may be interposed between the TSV 140 and the semiconductor substrate 110. The spacer insulation layer 145 may prevent the semiconductor substrate 110 or circuit devices in the circuit layer 120 from directly contacting the TSVs 140. The spacer insulation layer 145 may not be formed on protruding portions of the TSVs 140 that come in contact with the plated pad 160. The spacer insulation layer 145 may be formed of an oxide film or a nitride film. For example, the spacer insulation layer 145 may be formed of a silicon oxide ($SiO_2$) film.

In the present embodiment, the TSVs 140 may have a via-middle structure. Structures of the TSVs 140 may be a via-first structure, a via-middle structure, and a via-last structure. The via-first structure refers to a structure in which a TSV is formed before the circuit layer 120 is formed. The via-middle structure refers to a structure in which a TSV is formed between forming the circuit layer 120 and the wiring layer 130. The via-last structure refers to a structure in which a TSV is formed after forming the wiring layer 130.

The polymer pattern layer 150 is formed on the second surface 102 of the semiconductor substrate 110 and may surround the upper portions of the sidewalls of each of the TSVs 140. The polymer pattern layer 150 may be formed via an exposure process using a phase shift mask (PSM). The polymer pattern layer 150 functions as a buffer layer, and may reduce or prevent permeation of a polymer into the semiconductor substrate 110 or the TSVs 140 in a later photolithographic process, and may reduce or prevent a wet chemical attack during wet-etching for the TSVs 140. Furthermore, the polymer pattern layer 150 may surround the sidewalls of each of the TSVs 140 to support the TSVs 140 in order to reduce the possibility that the TSVs 140 bend, break or otherwise suffer damage during later processing steps.

In a conventional process related to TSVs, a first recess process, a CMP process, a second recess process, a CVD process for mark aligning, and a photo-resist (PR) coating process are performed in the order stated. However, in the present embodiment, a PR coating process using a polymer is performed immediately after a first recess process, and thus as many as three of the processes (the CMP process, the second recess process, and the CVD process) that are used in forming TSVs via conventional methods may be omitted according to some embodiments of the present invention. As a result, processing time and/or cost may be significantly reduced. Furthermore, via folding defects, which refer to damage that may occur to a TSV because of breaking or bending may occur with some frequency during a CMP process. However, in the present embodiment, the CMP process may be omitted, and thus, via folding defects and damage due to additional attacks may be reduced or prevented. Furthermore, by etching only a portion of the spacer insulation layer 145 on the protruding top surface of each of the TSVs 140, e.g., SiO$_2$ etching, the size of an opening may be reduced. As a result, oxidation of the metal may be reduced and the lower portion of the spacer insulation layer 145 may remain intact.

Furthermore, as shown in FIG. 1, since a CMP process is omitted in the present embodiment, the TSVs 140 may protrude above surrounding polymer pattern layers 150 in the final structure. Thus, the structural characteristic of the finished device may be different when the CMP process is omitted. Furthermore, instead of forming an alignment key by silicon etching as in the related art, an alignment key may be formed using the polymer pattern. That is, an alignment key, which is used to improve precision regarding an alignment key image and performance of photo processes in a later pad plating process, may be secured via the phase shifting mask (PSM) application.

A method of fabricating a semiconductor device according to the present embodiment will be described below in detail with reference to FIG. 1.

The polymer pattern layer 150 may be formed of, for example, poly-2-methoxyethylacrylate (PMEA), a polystyrene-based resin, or a polyimide-based resin. The polymer pattern layer 150 may have a curing degree equal to or higher than 83%. The polymer pattern layer 150 may not have an overall uniform thickness and hence may have the protrusions A and B, as shown in FIG. 1.

For example, the polymer pattern layer 150 may have the protrusion B at an end of a semiconductor chip and the protrusion A between the two TSVs 140. The protrusion A that is between the two TSVs 140 may be formed when the distance W1 between the two TSVs 140 is sufficiently large, e.g., 40 μm or larger. However, even if the distance W1 between the two TSV 140 is less than 40 μm, the protrusion A may still be formed in some embodiments.

The polymer pattern layer 150 may be formed to have a thickness from about several microns to dozens of microns from the second surface 102 of the semiconductor substrate 110. Furthermore, the height H3 of the protrusions A and B of the polymer pattern layer 150 may be greater than the protruding height H1 of the TSV 140. For example, if the protruding height H1 of the TSV 140 may be from about 6 μm to about 7 μm from the second surface 102 of the substrate 110, the height H3 of the protrusions A and B of the polymer pattern layer 150 may be from about 9 μm to about 10 μm. Furthermore, if the protruding height H1 of the TSV 140 is from about 1 μm to about 2 μm, the height H3 of the protrusions A and B of the polymer pattern layer 150 may be from about 4 μm to about 5 μm.

Although the material, structure, and thickness (height) of the polymer pattern layer 150 have been described above, the present embodiment is not limited thereto. For example, the polymer pattern layer 150 may be formed to have any various structure and thickness, and may be formed of a polymer having a predetermined curing degree, which is a material different from the materials stated above, through an exposure process. A method of forming the polymer pattern layer 150 will be described below in closer detail with reference to FIGS. 6A through 6H.

Referring still to FIG. 1, the electrode pad 170 may be formed on the intermetal insulation layer 132 and may be connected to the wiring 134 in the wiring layer 130 via the vertical plug 136. An interlayer insulation layer may be interposed between the interracial insulation layer 132 and the electrode pad 170, and the electrode pad 170 and the wiring 134 may be connected to each other via a vertical contact penetrating the interlayer insulation layer.

A passivation layer 172 may be formed on the bottom surface of the intermetal insulation layer 132 and side surfaces of the electrode pad 170. The passivation layer 172 may protect the bottom surface of the semiconductor chip 100. The passivation layer 172 may be formed, for example, of an oxide layer, a nitride layer, or a double layer including an oxide layer and a nitride layer. Furthermore, the passivation layer 172 may be formed as an oxide layer, e.g., a SiO$_2$ layer, via a HDP-CVD process.

A connecting member 180 may be formed on the electrode pad 170. The connecting member 180 may include a metal pillar 182 and a micro-bump 184. The metal pillar 182 may be formed via electrolyte plating and may have a cylindrical shape. In the present embodiment, the metal pillar 182 may be formed of Cu. However, a material constituting the metal pillar 182 is not limited to Cu. For example, the metal pillar 182 may be formed of Al, Ni, Au, or an alloy thereof. Meanwhile, the metal pillar 182 may be formed to have not only a cylindrical shape, but also any various shape, such as a rectangular pillar shape, an elliptical pillar shape, etc.

The micro-bump 184 is formed on the metal pillar 182 and may be formed of tin (Sn). The micro-bump 184 may alternatively be formed of, for example, Sn, Pd, Ni, Ag, or an alloy thereof. The micro-bump 184 may have a hemispheric shape. The micro-bump 184 may be formed to have a hemispheric shape via a reflow process. For example, the reflow process may be used to form a micro-bump 184 that has a shape that is slightly different from a hemisphere. For example, a portion of the micro-bump 184 may flow slightly downward and extend to (or beyond) the side surface of the metal pillar 182.

In a semiconductor chip according to the present embodiment, the upper portion of each TSV that protrudes above the second surface 102 of the semiconductor substrate 100 may be partially surrounded by a polymer pattern layer, and a plated pad may be formed on the protruding portion of the TSV. As a result, according to the present embodiment, the polymer pattern layer may reduce the probability that the TSV breaks during stacking of the semiconductor chips. Furthermore, a separate planarizing process, such as a CMP, and an additional recess process may be omitted, and thus the process for forming the plated pad may be simplified.

In a semiconductor chip according to the present embodiment, the structure of the polymer pattern layer 150, the structure of the protruding portion of the TSV 140, and the structure of the plated pad 160 are not limited to the specific structures shown in FIG. 1. In other words, a semiconductor chip including protruding TSVs, in which each TSV is surrounded by a polymer pattern layer and a plated pad contacting the protruding portion of each TSV is formed, is within the technical spirit of the inventive concept.

FIGS. 2 through 5 are sectional views of semiconductor chips having TSVs according to further embodiments of the inventive concept. For convenience of explanation, the descriptions given above with reference to FIG. 1 will not be repeated.

Figure 2:
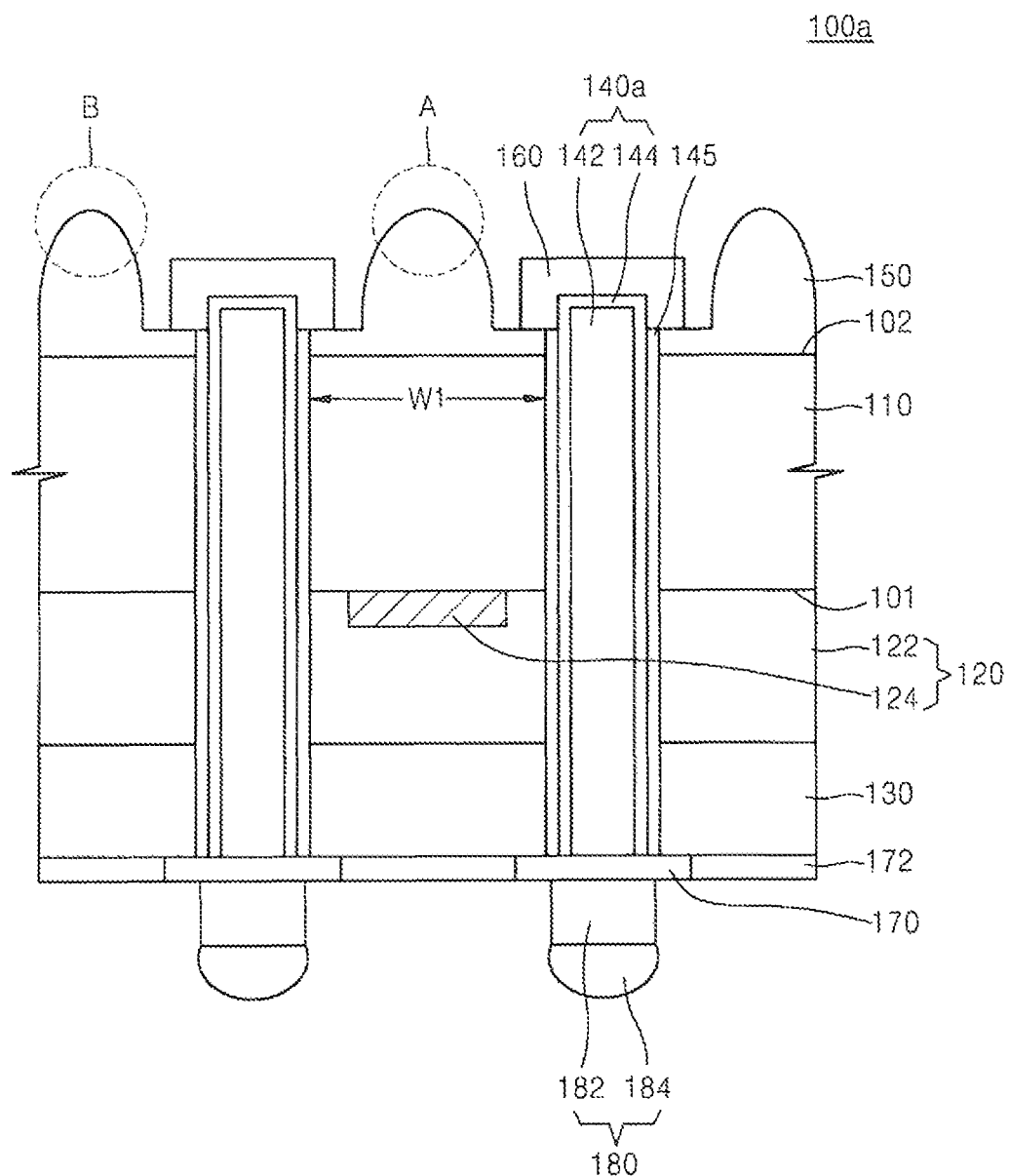
FIGS. 2, 3, 4, 5A and 5B are sectional views of semiconductor chips having TSVs according to embodiments of the inventive concept.

Referring to FIG. 2, a semiconductor chip 100a according to further embodiments of the inventive concept may be different from the semiconductor chip 100 of FIG. 1 with regard to a structure of a TSV 140a. Specifically, in the semiconductor chip 100a, the TSV 140a may penetrate through the wiring layer 130 and extend to the electrode pad 170. The TSV 140a may be formed in a via-middle process or a via-last process. Furthermore, a via-first process that is applied before forming a circuit on a substrate may also be included. Hereinafter, the TSV 140a extending to an electrode pad as in the present embodiment may also be applied to semiconductor chips according to other embodiments below.

Figure 3:
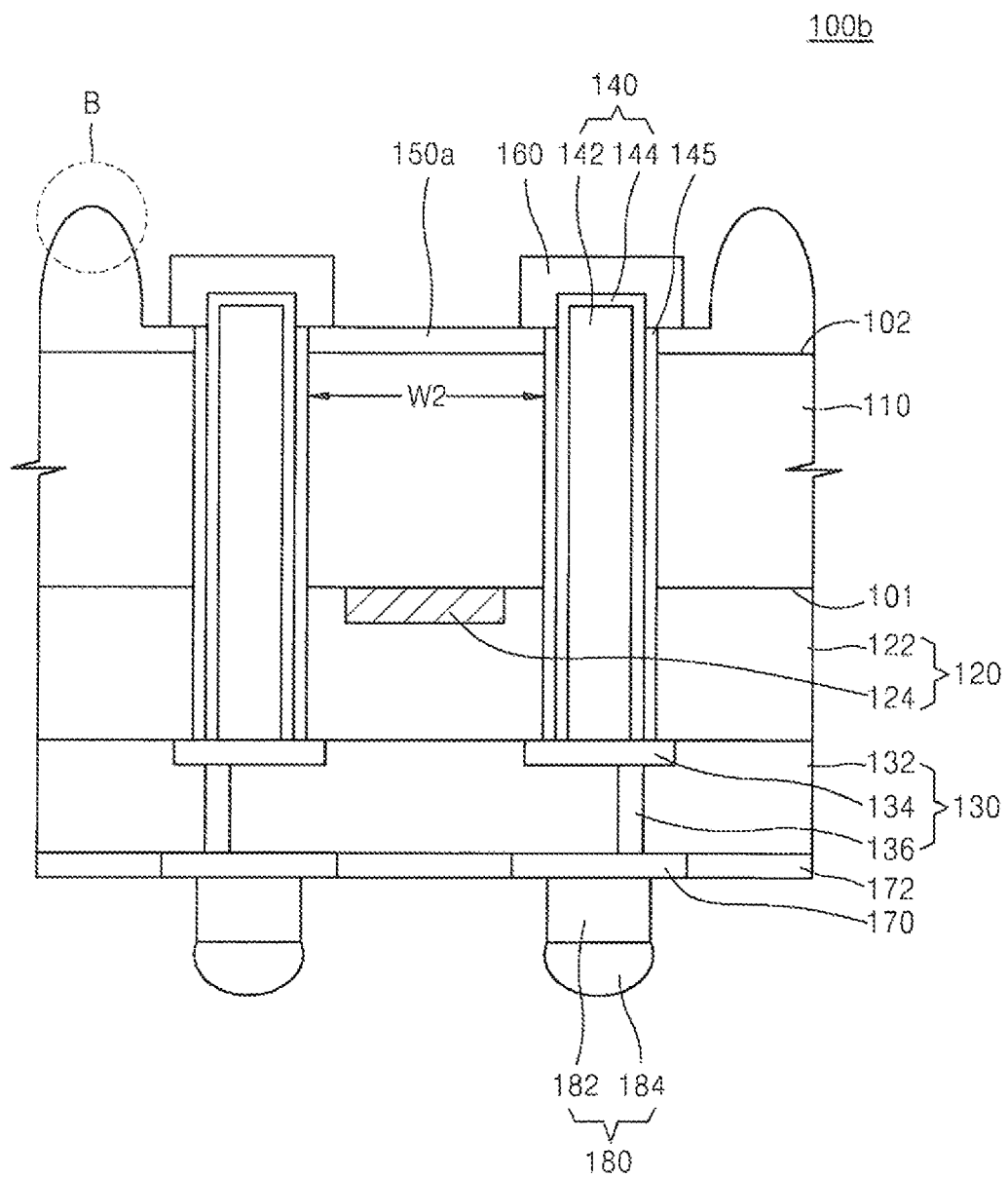

Referring to FIG. 3, a semiconductor chip 100b according to still further embodiments of the inventive concept may be different from the semiconductor chip 100 of FIG. 1 with regard to a polymer pattern layer. In particular, in the semiconductor chip 100b, the thickness (height) of the portion of the polymer pattern layer 150a that extends between two adjacent TSVs 140 may be uniform. In other words, no protrusion "A" may be formed between the two adjacent TSVs 140.

In the semiconductor chip of FIG. 1, the protrusion A of the polymer pattern layer 150 may be formed between the two TSVs 140 when a distance between the two TSVs 140 is sufficient. Furthermore, a protrusion may be formed to prevent short-circuit between the plated pads 160 that are formed on the respective TSVs 140. However, even if a distance between the two TSVs 140 is relatively small, if a short-circuit between the plated pads 160 is unlikely, the protrusion between the two TSVs 140 in the polymer pattern layer 150 may be omitted.

For example, if a distance W2 between the two TSVs 140 is 40 μm or smaller, the polymer pattern layer 150 may not have a protrusion between the two TSVs 140. However, even if a distance W2 between the two TSVs 140 is 40 μm or smaller, the polymer pattern layer 150 may have a protrusion between the two TSVs 140 to reduce the likelihood of a short-circuit. An exposure pattern for forming the polymer pattern layer 150a having a uniform thickness between the two TSVs 140 will be described below with reference to FIG. 8.

Referring still to FIG. 3, in the semiconductor chip 100b according to the present embodiment, a side surface of the plated pad 160 may be a predetermined distance apart from the protrusion B of the polymer pattern layer 150a. However, in other embodiments, a side surface of the plated pad 160 may be in contact with the protrusion B of the polymer pattern layer 150a.

Figure 4:
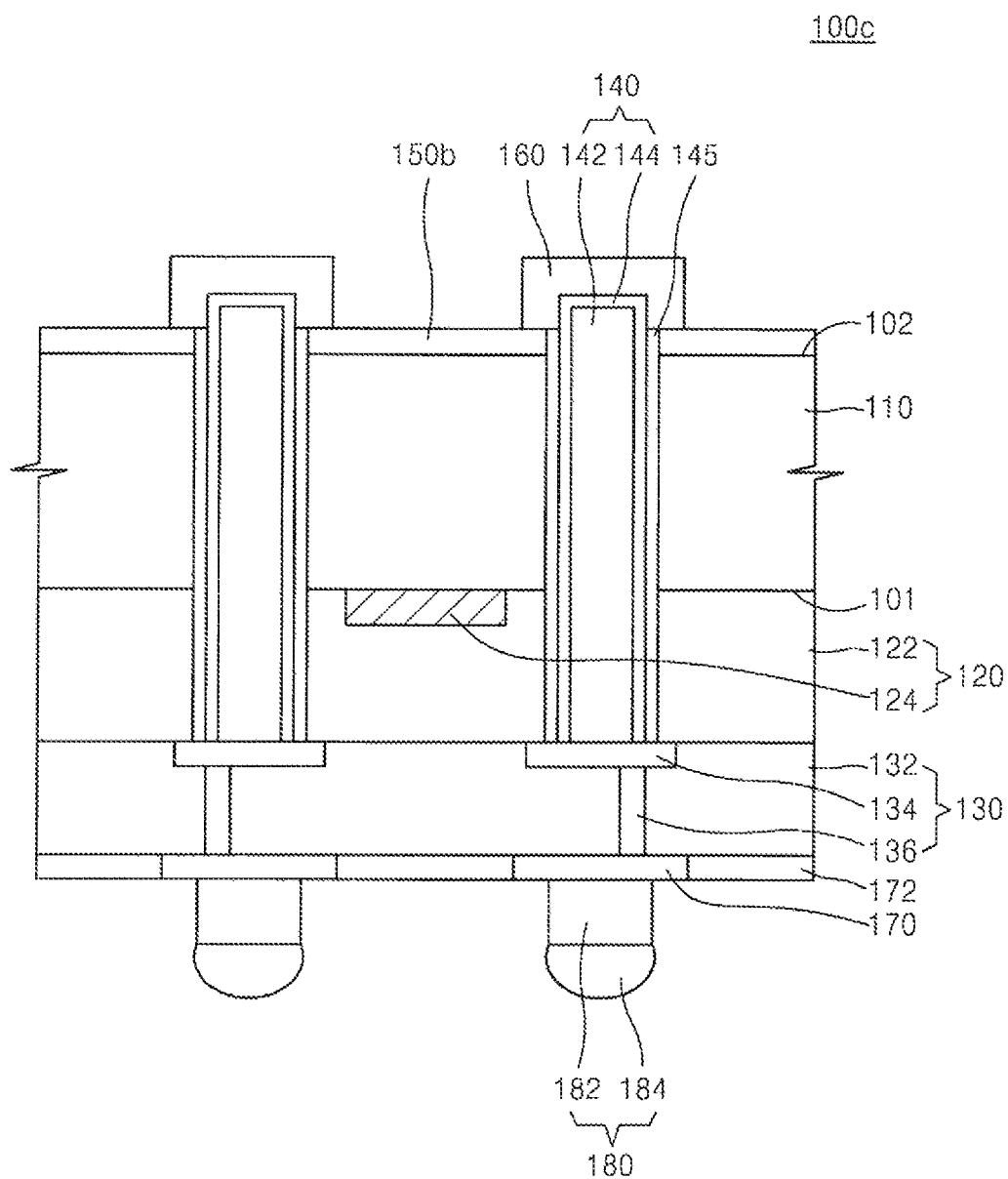

Referring to FIG. 4, a semiconductor chip 100c according to still further embodiments of the inventive concept may be different from the semiconductor chip 100 of FIG. 1 with regard to a polymer pattern layer 150b. In particular, in the semiconductor chip 100c according to the embodiment of FIG. 4, the polymer pattern layer 150b may not include a protrusion. In other words, the polymer pattern layer 150b may have an overall uniform thickness and no protrusion may be formed on the polymer pattern layer 150b regardless of the distance between two adjacent TSVs 140.

A thickness of the polymer pattern layer 150b may be several microns, and the protruding height of the TSV 140 from the top surface of the polymer pattern layer 150b may be several microns. If the protruding height of the TSV 140 is small and the size of the plated pad 160 is small, no protrusion may be formed on the polymer pattern layer 150b. For example, even if a distance between the two TSVs 140 is small, if the protruding height of the TSV 140 is small and the thickness of the plated pads 160 is small, the possibility of a short-circuit between plated pads 160 may be reduced, and thus, the protrusion on the polymer pattern layer 150b may be omitted.

A detailed description of a method of forming the polymer pattern layer 150b in the semiconductor chip 100c according to the embodiment of FIG. 4 will be given below with reference to FIGS. 9A through 9D.

Referring still to FIG. 4, although barrier metal layers 144 are included in the protruding TSVs 140 and 140a in the semiconductor chips of FIGS. 1 through 4, the TSV 140 may be formed to only have the wiring metal layer 142. In this case, the wiring metal layer 142 may be exposed, and the plated pad may be formed on the exposed portion of the wiring metal layer 142 or, alternatively, a seed metal may be deposited and the plated pad may be formed on the seed metal.

Figure 5A:
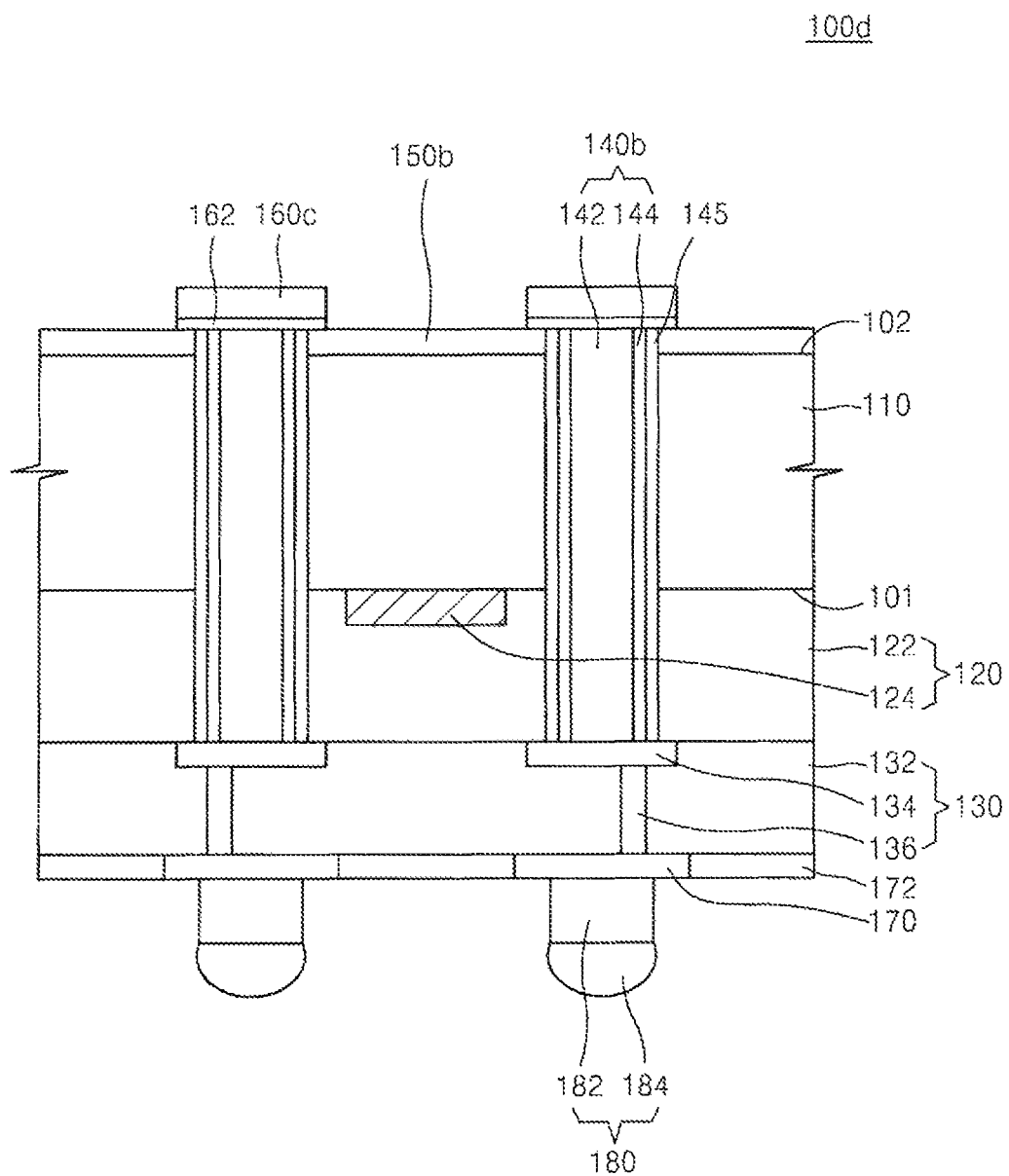

Referring to FIG. 5A, a semiconductor chip 100d according to yet additional embodiments of the inventive concept may be different from the semiconductor chip 100c in terms of the structures of the TSVs 140b and the plated pads 160c. In particular, in the semiconductor chip 100d according to the present embodiment, the polymer pattern layer 150b has an overall uniform thickness like the semiconductor chip 100c of FIG. 4, and the top surface of the TSV 140b may be at the same height as the top surface of the polymer pattern layer 150b. Therefore, side surfaces of the TSV 140b are not exposed, and the barrier metal layer 144 may not exist on the exposed top surface of the TSV 140. Furthermore, the top surface of the spacer insulation layer 145 may also be at the same height as the top surface of the TSV 140b and the top surface of the polymer pattern layer 150b. Thus, the top surfaces of the polymer pattern layer 150b, the top surface of the TSVs 140b, the top surface of the barrier metal layer 144 and the top surface of the spacer insulation layer 145 may all be in the same plane.

A seed metal 162 may be formed on the top surface of each TSV 140b, and plated pads 160c may be formed on each seed metal pattern 162. Therefore, the plated pad 160c may be formed on the seed metal 162 and may have a panel-like shape. Side surfaces of the seed metal 162 and side surfaces of the plated pad 160c may be in the same planes. However, structure of the plated pad 160c is not limited thereto. For example, in other embodiments the plated pad 160c may surround the side surfaces of the seed metal 162 either partially or completely.

In the semiconductor chip 100d according to the present embodiment, the structure of the polymer pattern layer 150b may be formed by exposing the top surface of the TSV 140 by performing a CMP process to expose the polymer buffer layer. A detailed description thereof will be given below with reference to FIGS. 10A and 10B.

Regarding the semiconductor chip 100d according to the present embodiment, a CMP process may be performed to expose the top surface of the TSV 140b instead of a process for removing the spacer insulation layer 145. Furthermore, during the exposure process, a normal mask may be used instead of a phase shifting mask (PSM). Therefore, the fabrication process of the semiconductor chip 100d may be simplified. Moreover, even though a CMP process is performed, it is performed while the TSV 140b is surrounded by a polymer buffer layer 150b which may reduce the likelihood that the TSV 140b is damaged or broken during the CMP process.

Figure 5B:
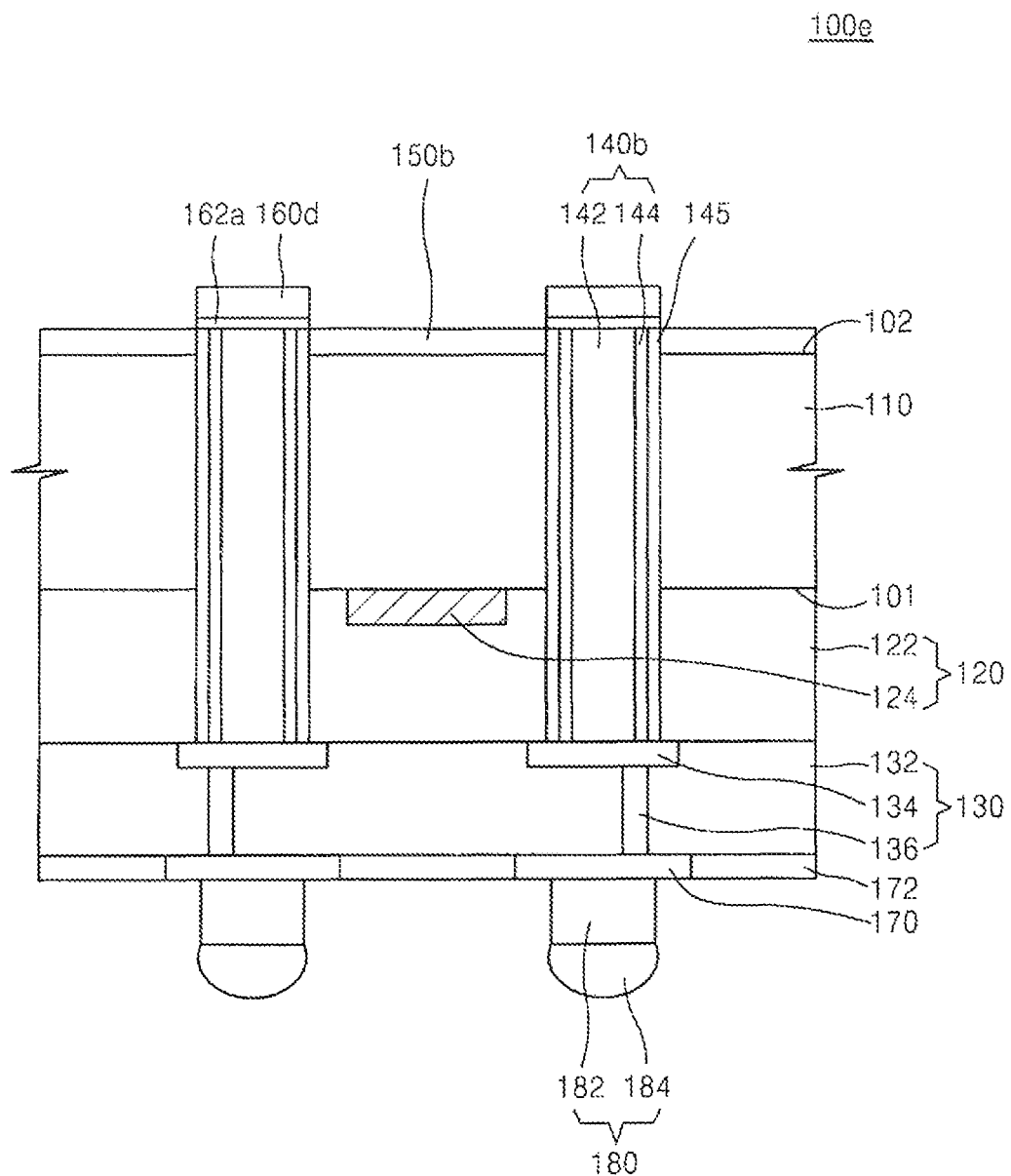

Referring to FIG. 5B, a semiconductor chip 100e according to still further embodiments of the inventive concept may be different from the semiconductor chip 100d of FIG. 5A with regard to structure of a plated pad 160d. In particular, in the semiconductor chip 100e according to the present embodiment, a width of the seed metal 162a and width of the plated pad 160d may be almost identical to the combined width of the TSV 140b and the spacer insulation layer 145. Accordingly, sidewalls of the seed metal 162a and sidewalk of the plated pad 160d may be aligned or almost aligned with outer sidewalls of the spacer insulation layer 145.

Furthermore, sidewalls of the seed metal 162a and sidewalls of the plated pad 160d may be located between outer sidewalls and inner sidewalls of the spacer insulation layer 145 (that is, outer sidewalls of the barrier metal layer 144). The seed metal 162a may be formed to completely cover the top surface of the wiring metal layer 142 and the top surface of the barrier metal layer 144.

FIGS. 6A through 6H are sectional views showing a process of fabricating a semiconductor chip according to an embodiment of the inventive concept.

Figure 6A:
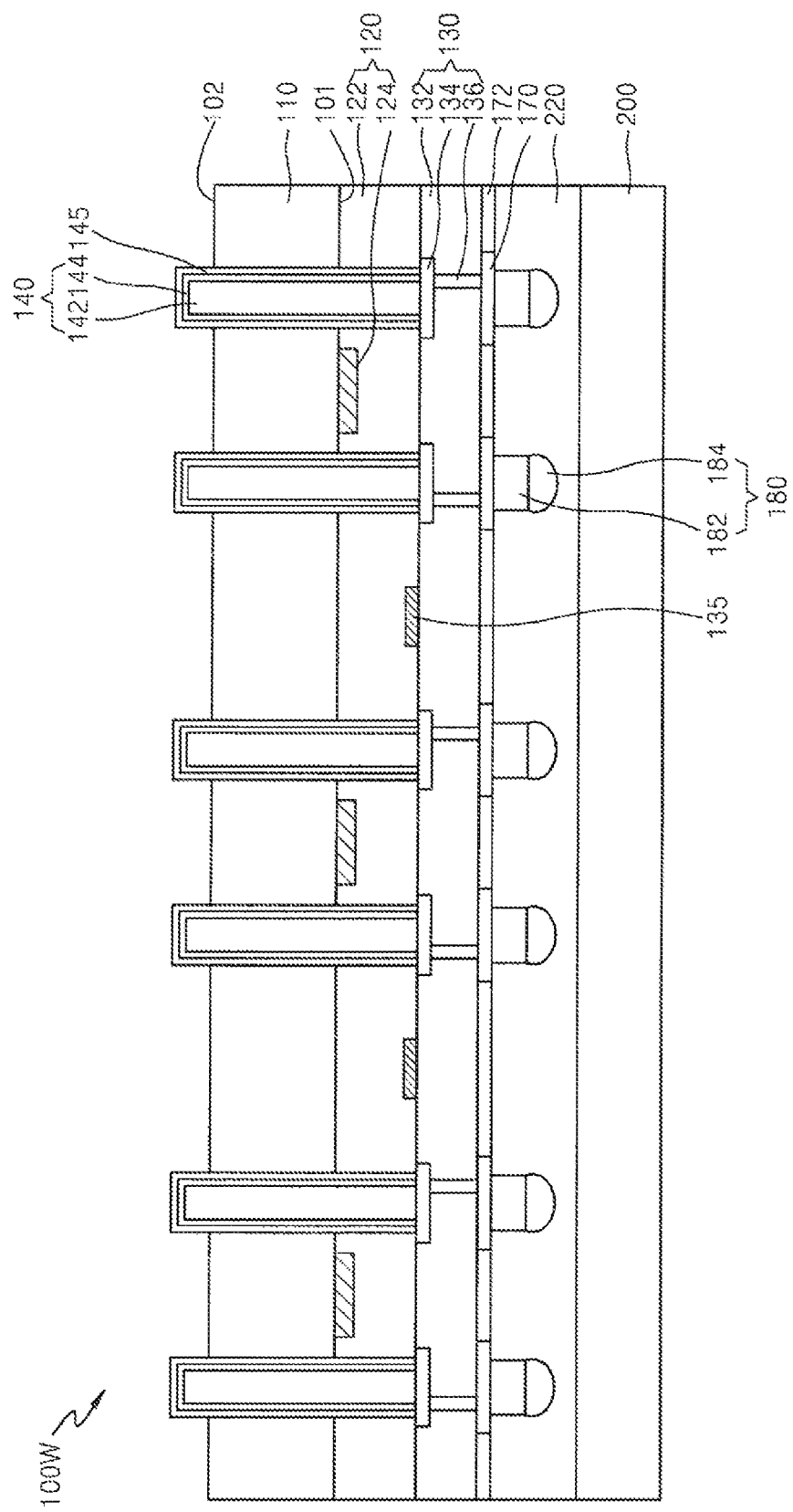
FIGS. 6A through 6H are sectional views showing a process of fabricating a semiconductor chip according to an embodiment of the inventive concept.

Referring to FIG. 6A, a wafer 100W is provided that includes a plurality of semiconductor chips in which TSVs 140 are formed. Each of the semiconductor chips may include a semiconductor substrate 110, a circuit layer 120, a wiring layer 130, TSVs 140, and a connecting member 180. An adhesive 220 is used to adhere the wafer 100W to a supporting substrate 200 which may comprise, for example, a glass substrate. Fabrication processes are performed on the back-side of the wafer 100W.

After the wafer 100W is adhered to the supporting substrate 200, a portion of the back-side of the wafer 100W, that is, the second surface 102 of the semiconductor substrate 110, is removed to a predetermined thickness to expose the TSVs 140 and the spacer insulation layer 145. Meanwhile, as shown in FIG. 6A, after the portion of the semiconductor substrate 110 is removed, the TSVs 140 and the spacer insulation layer 145 having predetermined heights may be exposed in the form of protrusions above the second surface 102 of the semiconductor substrate 110. For example, the protruding height of the TSV 140 may be from about 6 μm to about 7 μm. In other embodiments, the protruding height of the TSVs 140 may be from about 1 μm to about 2 μm.

The portion of the semiconductor substrate 110 may be removed via grinding, CMP, isotropic etching, anisotropic etching, or a combination thereof. For example, after the portion of the semiconductor substrate 110 is mostly removed by a CMP process, the semiconductor substrate 110 may be recessed to below the top surfaces of the spacer insulation layer 145 and the TSV 140 via an isotropic etching process, e.g., a wet-etching process.

The reference numeral 135 in FIG. 6A denotes an alignment key that may be formed in the wafer 100W, which may generally be used for separating a wafer into individual chips. In the present embodiment, although the alignment key 135 is formed in the circuit layer 120, the alignment key 135 may also or alternatively be formed in the semiconductor substrate 110 or the wiring layer 130.

Figure 6B:
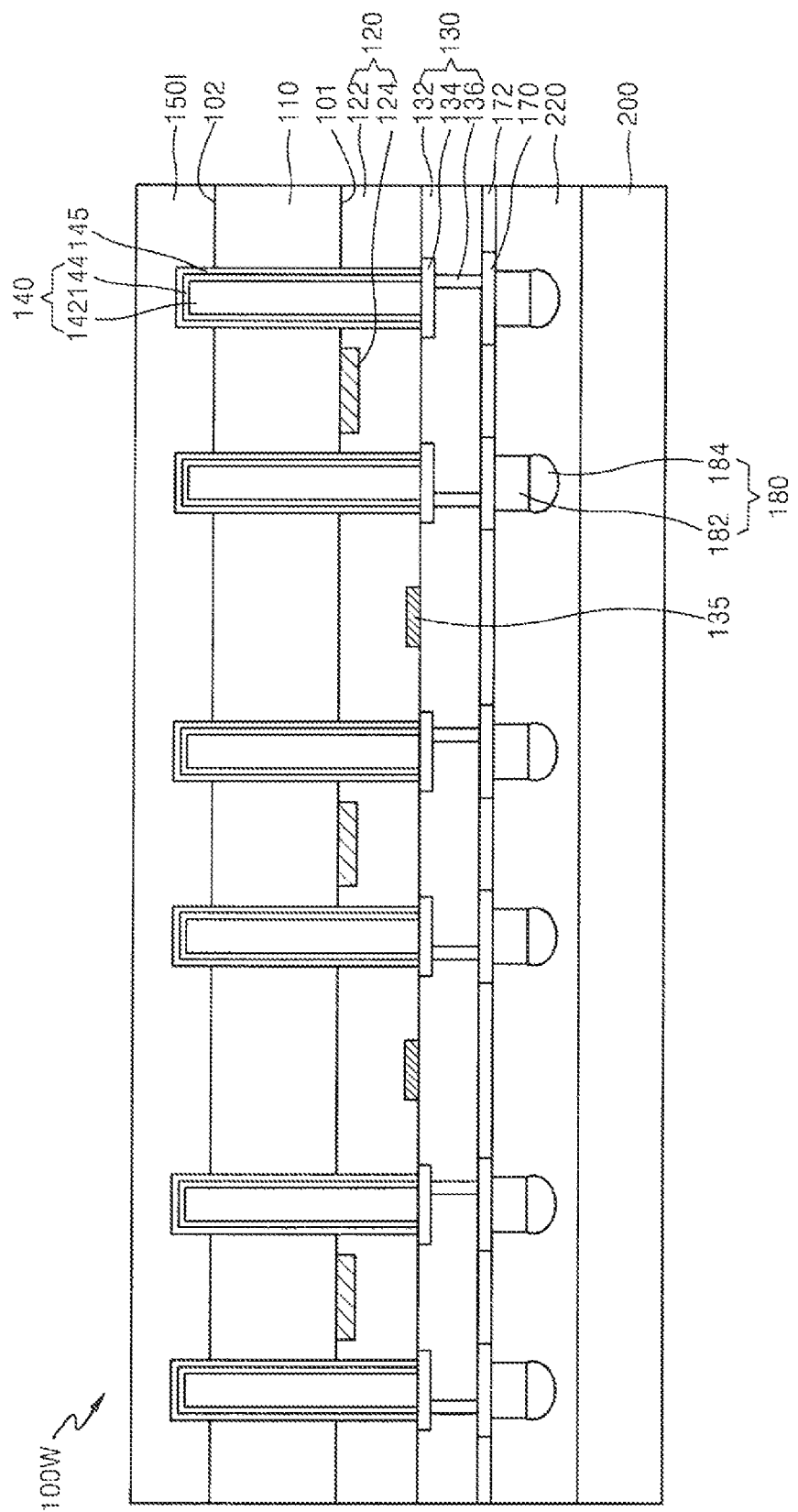

Referring to FIG. 6B, a polymer buffer layer 150I is formed on the semiconductor substrate 110. The polymer buffer layer 150I may be formed to have a thickness sufficient for completely covering the exposed spacer insulation layer 145 and the exposed TSVs 140. For example, if the protruding height of the TSVs 140 is from about 1 μm to about 2 μm, the polymer buffer layer 150I may be formed to have a thickness from about 4 μm to about 5 μm. If the protruding height of the TSVs 140 is from about 6 μm to about 7 μm, the polymer buffer layer 150I may be formed to have a thickness from about 9 μm to about 10 μm.

The polymer buffer layer 150I may be a polymer layer that may function as a buffer layer. The polymer buffer layer 150I may be a curable layer that has a curing degree that is greater than or equal to a predetermined curing degree in response to an exposure process. For example, the polymer buffer layer 150I may be formed of PMEA, a polystyrene-based resin, or a polyimide-based resin. Furthermore, the polymer pattern layer 150 formed of the resin may have a curing degree equal to or above 83%.

Figure 6C:
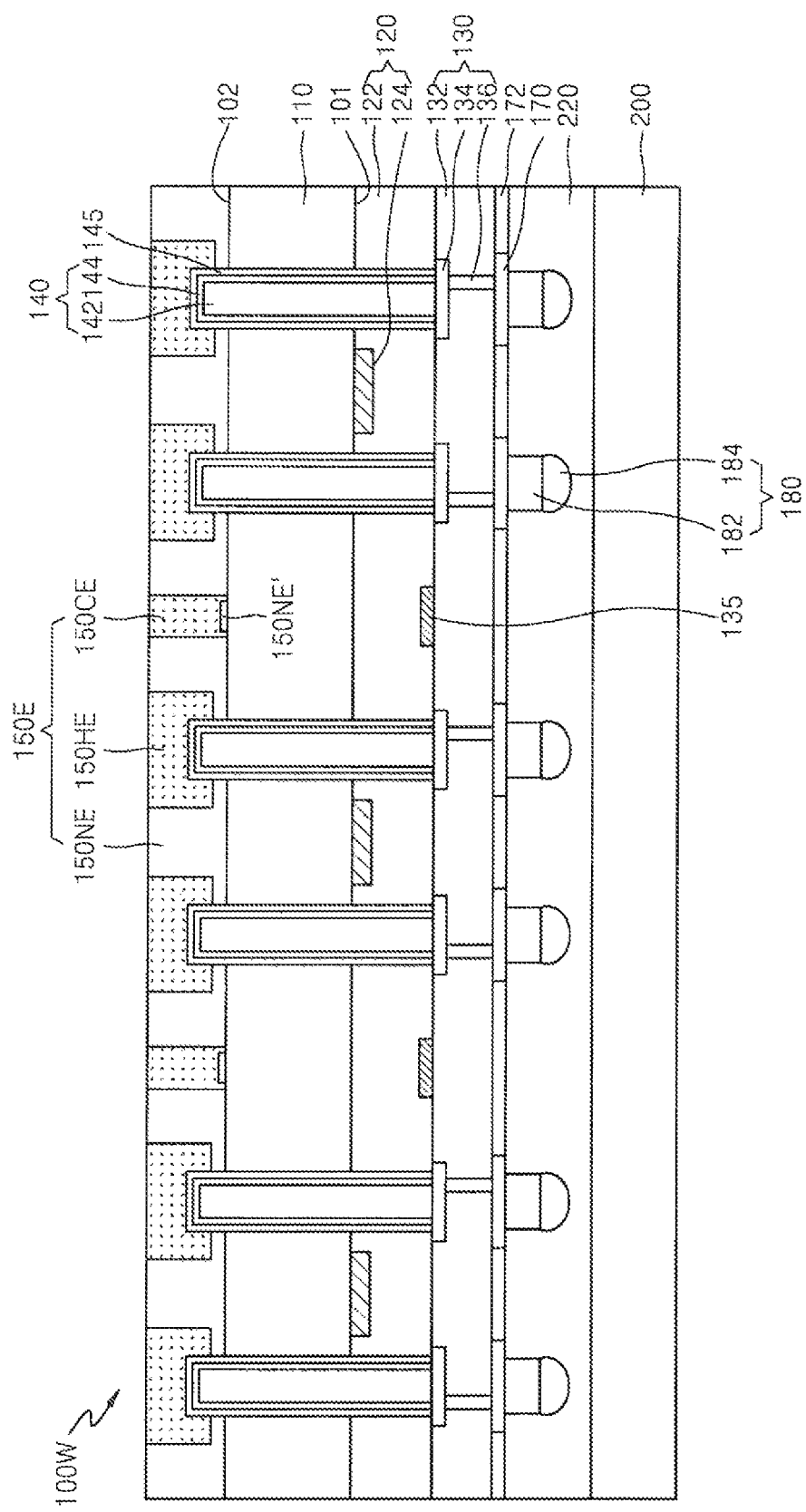

Referring to FIG. 6C, the polymer buffer layer 150I is exposed using a PSM. After this exposure process, the polymer buffer layer 150E may be divided into three regions. For example, the exposed polymer buffer layer 150E may be divided into an unexposed region 150NE, a half-exposed region 150HE, and a completely-exposed region 150CE. The unexposed region 150NE is a region that is not exposed to light during the exposure process. Therefore, properties of the polymer buffer layer 150I in the non-exposed region 150NE may be unchanged and remain constant after development. The half-exposed region 150HE is a region that is partially exposed to light. Therefore, the chemical properties of only a portion of the half-exposed region 150HE are changed. The completely-exposed region 150CE is a region that is completely exposed to light and the chemical properties of the polymer buffer layer 150I in the completely-exposed region 150CE are changed. The portions of the polymer buffer layer 150I which have their chemical properties changed may be dissolved by a developing agent and removed during a development process. In other embodiments, an opposite type of exposure process may be performed. For example, during a development process, unexposed portions may be removed and exposed portions may not be removed.

Meanwhile, an unexposed pattern 150NE' for an align mark may be formed in the completely-exposed region 150CE. The unexposed pattern 150NE' may be embodied by forming a blocking pattern in a portion of a PSM corresponding to the completely exposed region 150CE.

Figure 7:
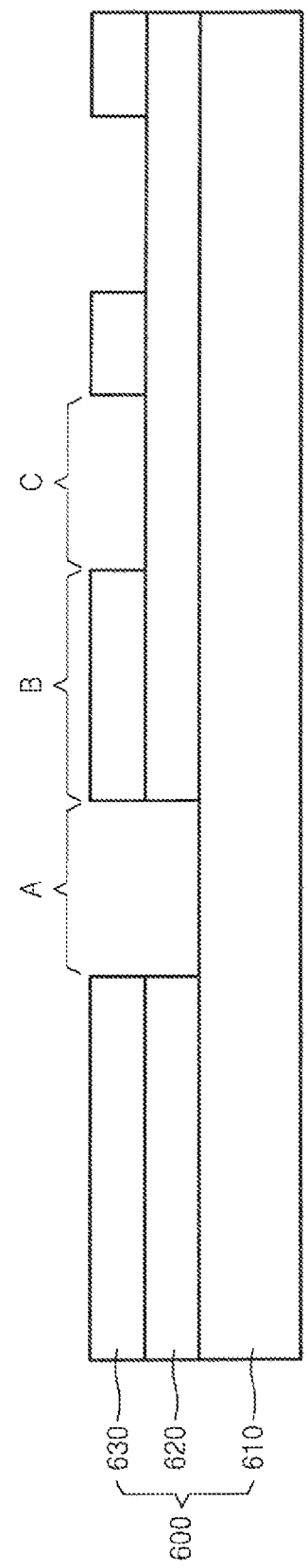
FIG. 7 is a sectional view of a phase shift mask (PSM) used in the exposure operation shown in FIG. 6C.

The general structure of a PSM according to some embodiments is shown in FIG. 7.

Referring to FIG. 7, a PSM 600 may include a quartz layer 610, a MoSiON layer 620, and a Cr layer 630. A portion A of the PSM 600 in which only the quartz layer 610 exists may correspond to a completely-exposed region. Furthermore, a portion B of the PSM 600 in which the MoSiON layer 620 and the Cr layer 630 exist on the quartz layer 610 may correspond to an unexposed region. Meanwhile, a portion C of the PSM 600 in which only the MoSiON layer 620 exists on the quartz layer 610 may correspond to a half-exposed region.

By adjusting the thicknesses, materials, or intervals between open regions of layers in the PSM 600, exposed regions suitable for a polymer buffer layer may be embodied in an exposure process.

Figure 6D:
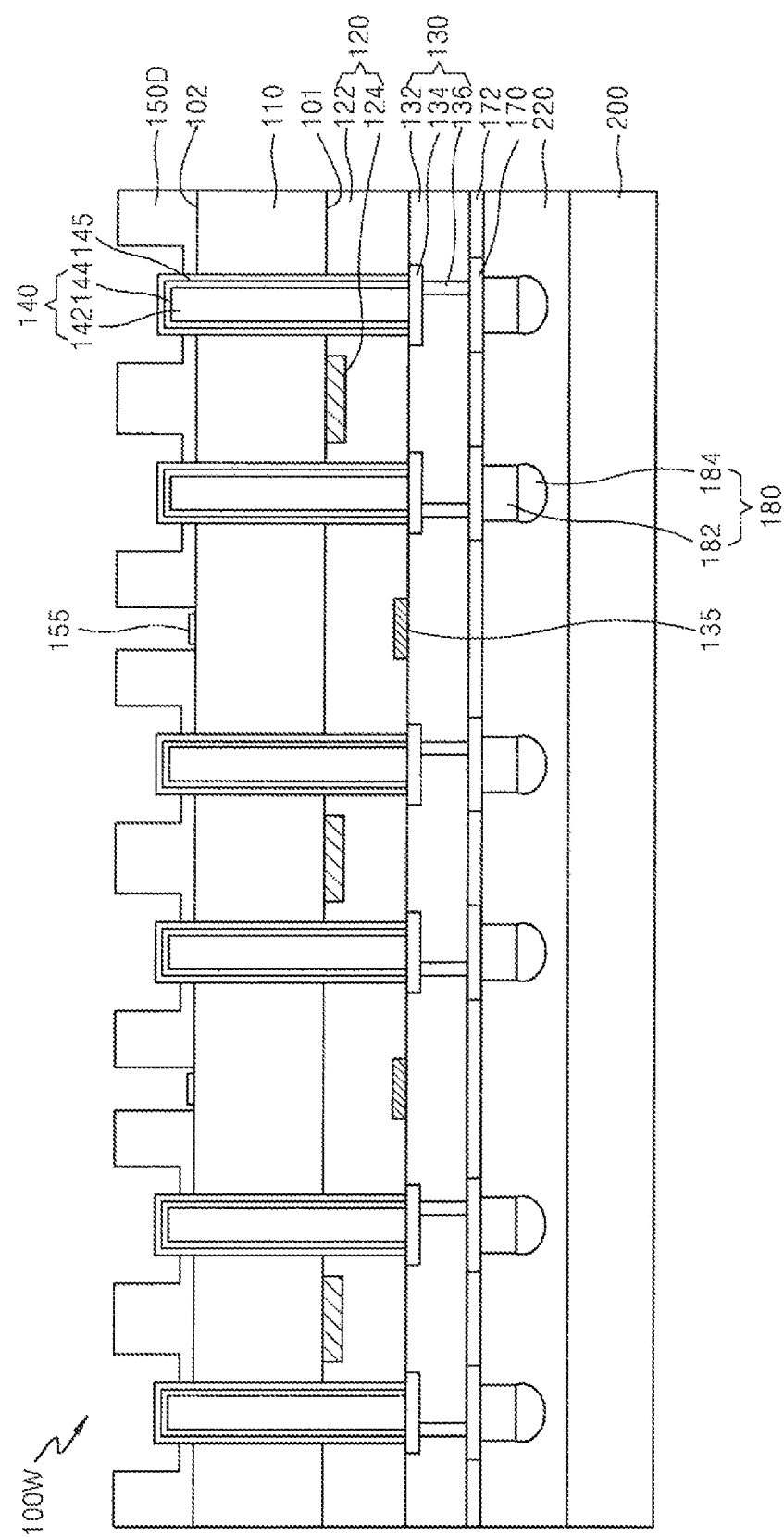

Referring to FIG. 6D, by performing a development process using an appropriate developing agent, portions of the exposed polymer buffer layer 150E that have had their chemical properties changed by light exposure may be removed. As shown in FIG. 6D, after the development process, a polymer alignment mark 155 may be formed in the completely-exposed region 150CE in correspondence to the alignment key 135 of the wafer 100W. The alignment mark 155 may be used in a pad photo process, a singulation process, etc.

After the development process, the TSVs 140 and the spacer insulation layers 145 may protrude and be exposed in portions of the polymer buffer layer 150D corresponding to the half-exposed region 150HE.

Figure 6E:
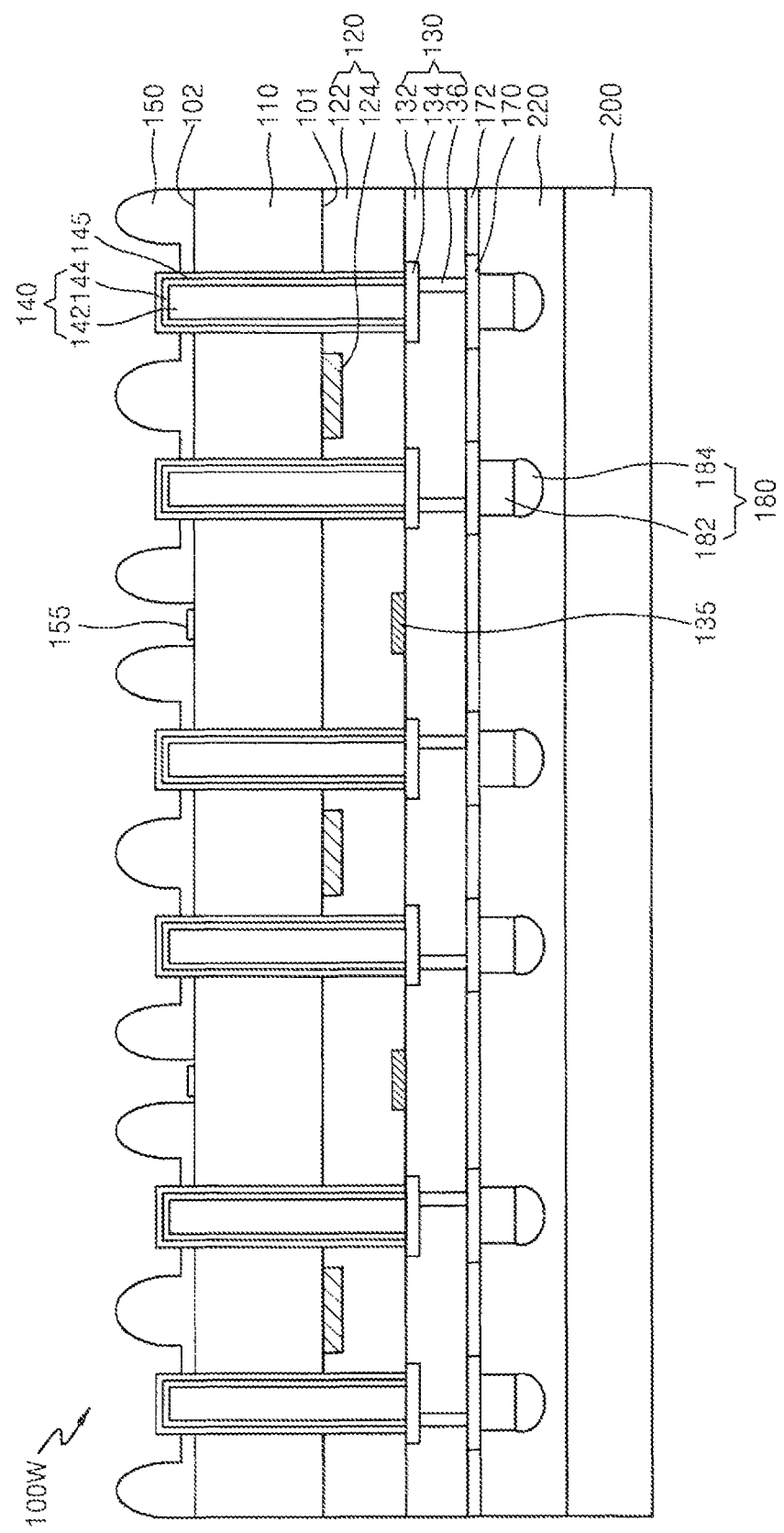

Referring to FIG. 6E, after the development process, a curing process is performed. The polymer buffer layer 150D may be partially reflowed and the polymer pattern layer 150 with predetermined protrusions may be formed via the curing process. The protrusions may be located at a portion close to a scribe lane S/L at which the align mark 155 is formed and between the two TSVs 140, respectively.

The curing process may be performed, for example, at a temperature equal to or below 200° C. for about 6 hours to about 8 hours. However, conditions of the curing process are not limited to the above temperature and time. The temperature and time for performing the curing process may be suitably adjusted according to polymer materials and thicknesses of a polymer buffer layer.

Meanwhile, a cleaning process for removing excess polymer may be performed after the development process and/or after the curing process.

Figure 6F:
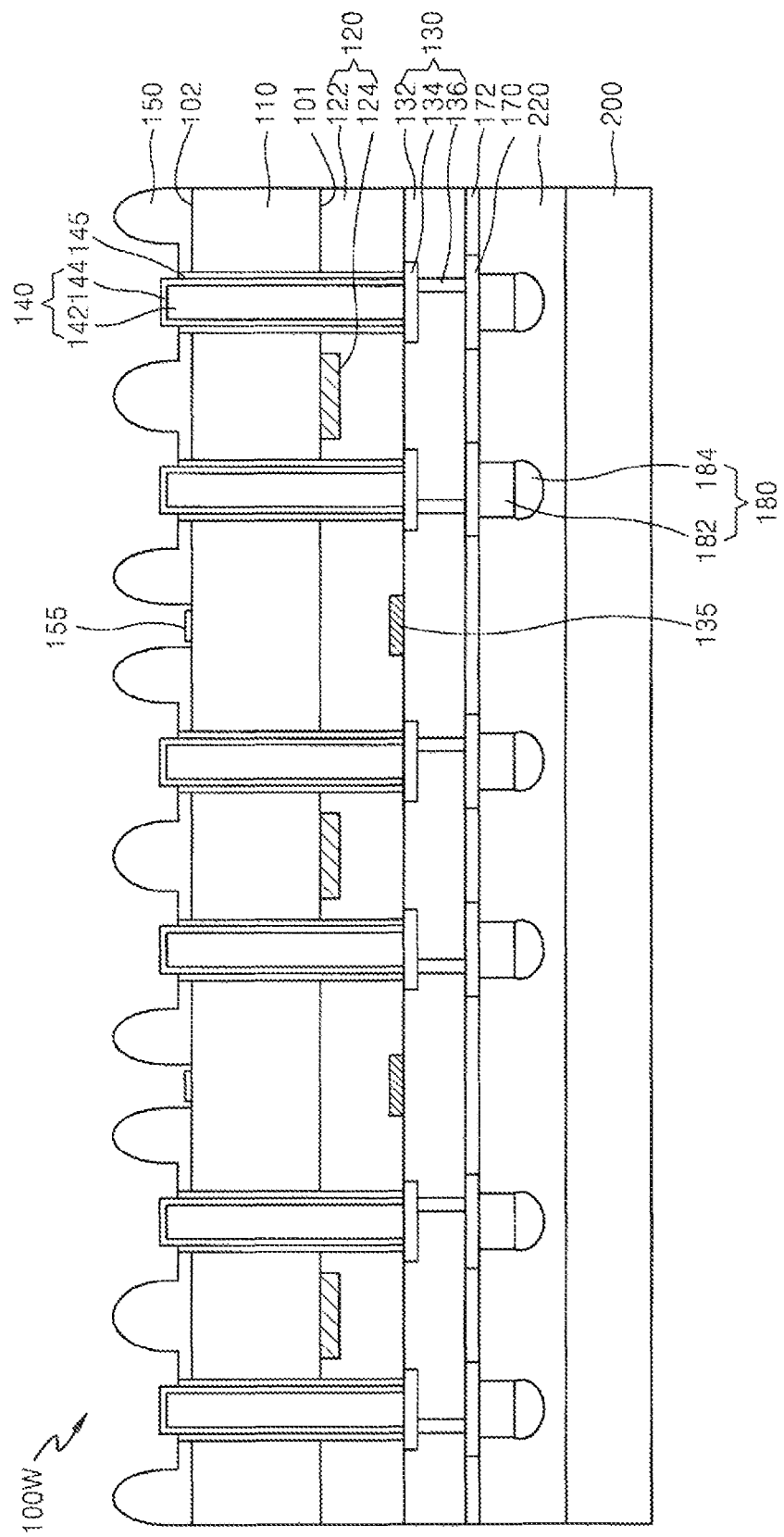

Referring to FIG. 6F, the spacer insulation layer 145 that surrounds the protruding TSVs 140, e.g., a $SiO_2$ film, is removed to expose the barrier metal layer 144. The spacer insulation layer 145 may be removed via a dry-etching process. The etch selectivity of the etchant used to remove the spacer insulation film 145 may be selected so that negligible etching of other layers occurs. In some embodiments, the barrier metal layer 144 may then be removed by an additional etching process to expose the wiring metal layer 142, while the barrier metal layer 144 may be left in place in other embodiments. In still other embodiments, the barrier metal layer 144 may be removed together with the spacer insulation layer 145 by selecting an appropriate etchant. Furthermore, in a case where the TSVs 140 does not include the barrier metal layer 144, the wiring metal layer 142 may be exposed by removing the spacer insulation layer 145.

According to conventional methods, after the exposure of a TSV 140 via a first recess process as shown in FIG. 6A, a pad forming process is performed after a CMP process, a second recess process, a CVD process, and an alignment key forming process are performed. However, according to the present embodiment, the CMP process, the second recess process, and the CVD process may be omitted, and an alignment key may be immediately formed by performing an exposure process on a polymer buffer layer using a PSM.

Figure 6G:
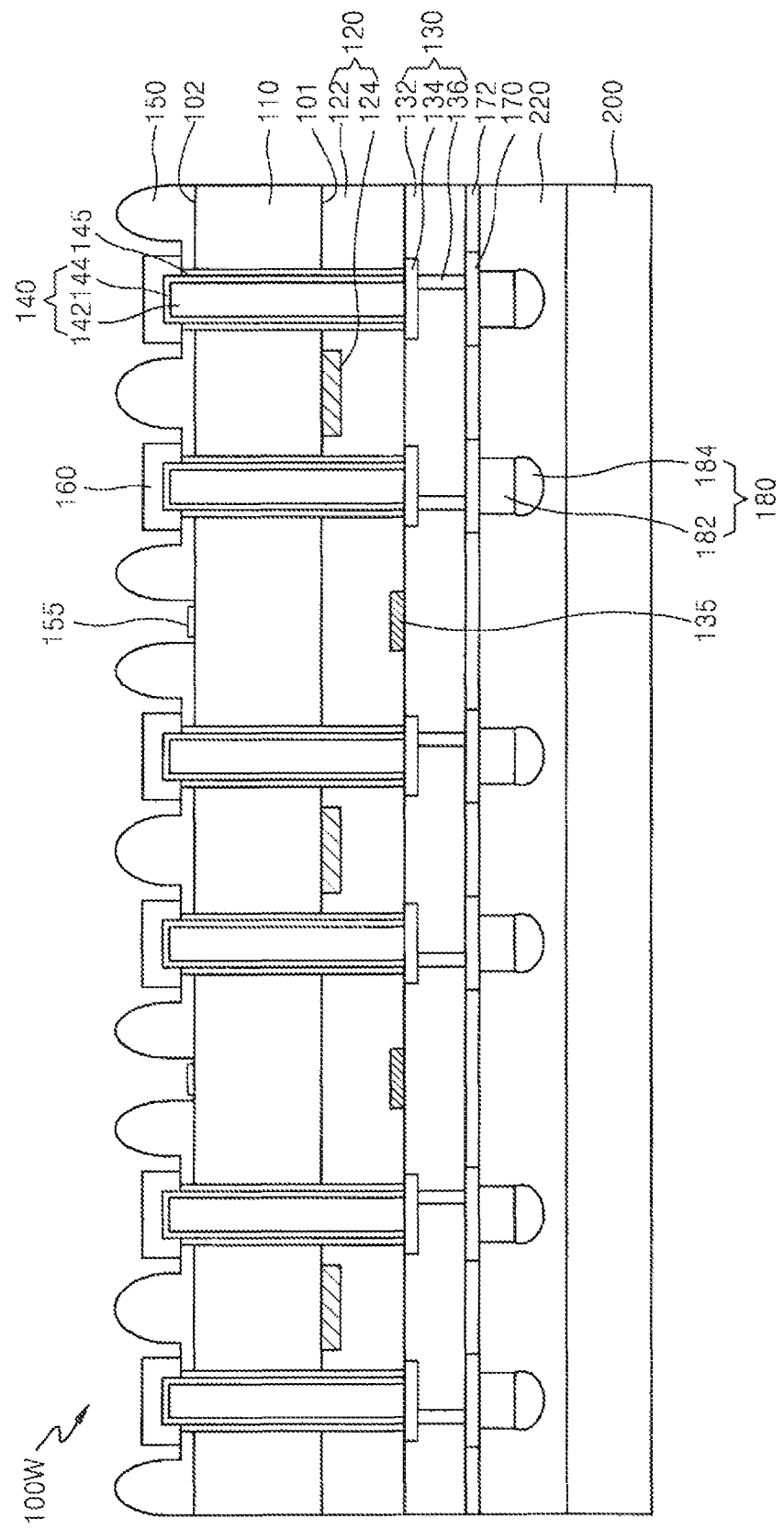
Figure 6H:
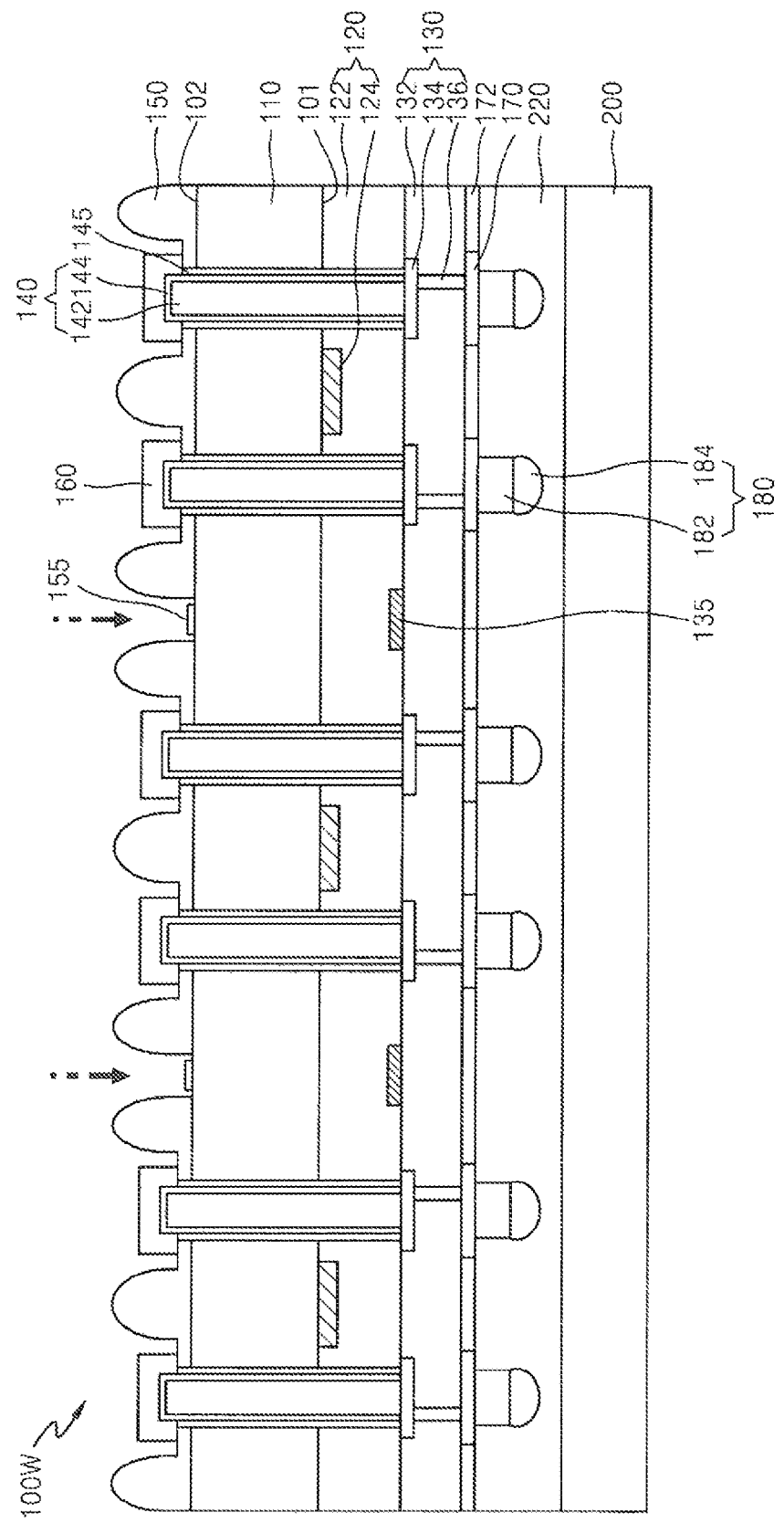

Therefore, as a CMP process is omitted, follow-up processes, such as a plating process, may be performed on TSVs that protrude above surrounding polymer patterns in the final structure (refer to FIG. 1 or FIG. 6H). The structural characteristic indicates that a CMP process is omitted. Furthermore, instead of forming an alignment key by silicon etching as in the related art, an alignment key is formed by using a polymer pattern, and thus, an alignment key, which is used for improved precision regarding an alignment key image and performance of photo processes in a later pad plating process, may be secured via a PSM application.

Referring to FIG. 6G, the plate pad 160 is formed by using the exposed barrier metal layer 144 of the wiring metal layer 142 as a seed metal. The plated pad 160 may be formed of, for example, Au, Ni/Au, Ni/Pd/Au, or Cu and may be formed to have a thickness of several μm. For example, a thickness of the plated pad 160 from the top surface of the TSV 140 may be from about 1 μm to about 3 μm.

Although not shown, a pad photo process may be performed before the plated pad 160 is formed. In other words, after the spacer insulation layer 145 is removed, a barrier metal (not shown), e.g., Ni or Ti/Cu, may be formed on the polymer pattern layer 150 and the TSVs 140 to a thickness from about 1 μm to about 3 μm or respective thicknesses below 1 μm, and a photoresist (PR) pattern may then be formed that covers regions where the plated pads 160 are to be formed. The barrier metal 144 is removed via an etching process using the PR pattern as a mask, and the PR pattern is removed by ashing and/or stripping. After this pad photo process, the barrier metal only remains in the portions on which the plated pads 160 are to be formed. The plated pads 160 may be formed by performing a plating process in which the remaining barrier metal is used as a seed metal.

Referring to FIG. 6H, after forming the plated pads 160, a semiconductor chip as shown in FIG. 1 may be completed by separating the wafer 100W into individual chips by sawing the wafer 100W along the scribe lane S/L, by using a laser or a blade, and the align mark 155 formed at the scribe lane S/L may be removed during this sawing process.

Figure 8:
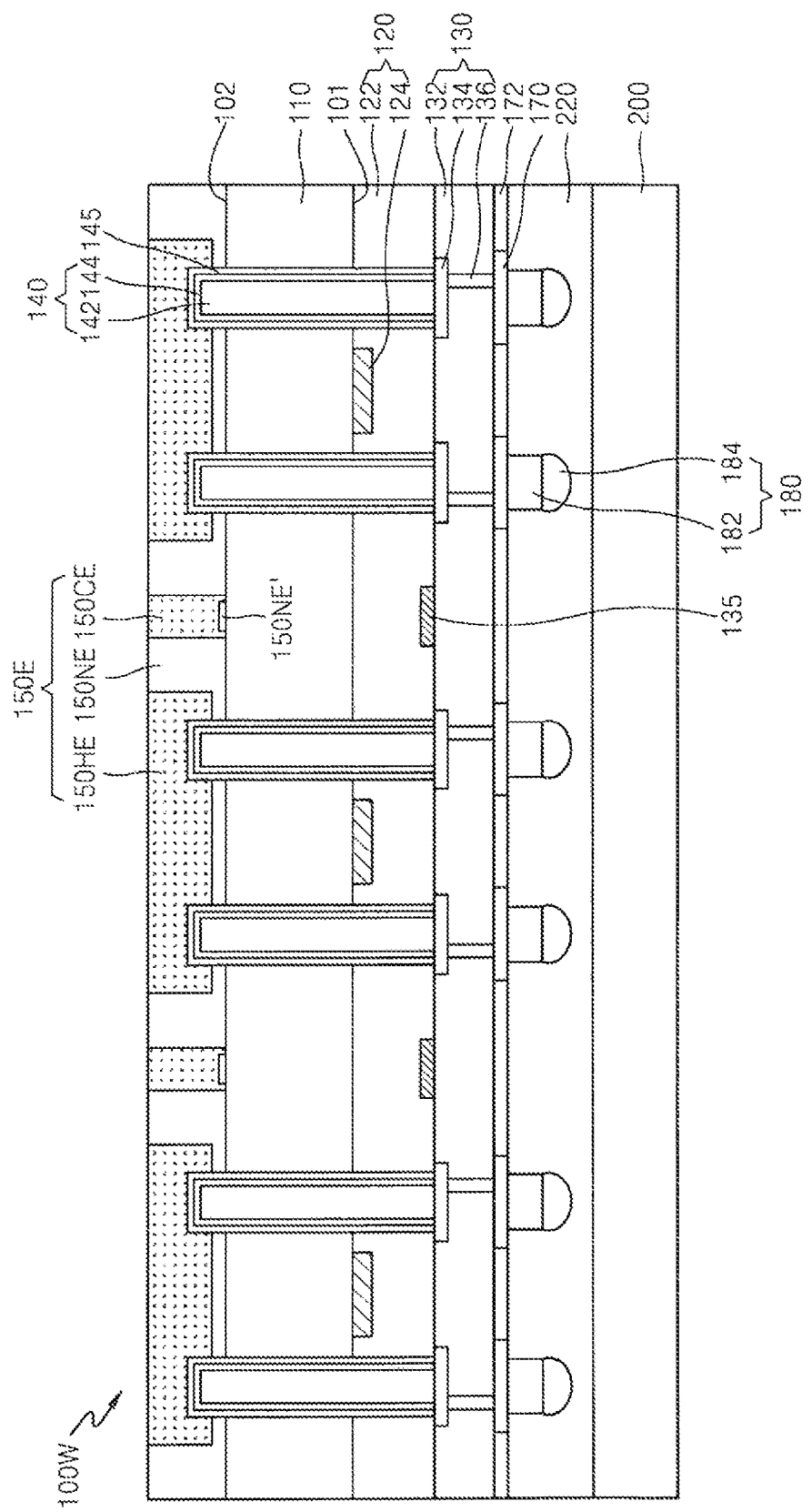
FIG. 8 is a sectional view showing a process corresponding to the exposure process of FIG. 6C for fabricating the semiconductor chip according to the embodiment of FIG. 3.

FIG. 8 is a sectional view showing a process corresponding to the exposure process of FIG. 6C, for fabricating the semiconductor chip 100*b* according to the embodiment as shown in FIG. 3.

Referring to FIG. 8, to fabricate the semiconductor chip 100*b* shown in FIG. 3, an exposure process may be used to form exposed regions in the polymer buffer layer 150I as shown in FIG. 8. In the present embodiment, the exposed polymer buffer layer 150E may be divided into the unexposed region 150NE, the half-exposed region 150HE, and the completely-exposed region 150CE. However, unlike the embodiment depicted in FIG. 6C, the half-exposed region 150HE may be formed to have an uniform thickness between the two TSVs 140. The exposed region 150E may be embodied by adjusting a structure of a PSM.

A semiconductor chip having the structure as shown in FIG. 3 may be embodied by performing the processes shown in FIG. 6D to FIG. 6H after an exposed region is formed as in the present embodiment.

FIGS. 9A through 9D are sectional views showing a process of fabricating a semiconductor chip according to the embodiment as shown in FIG. 4.

Figure 9A:
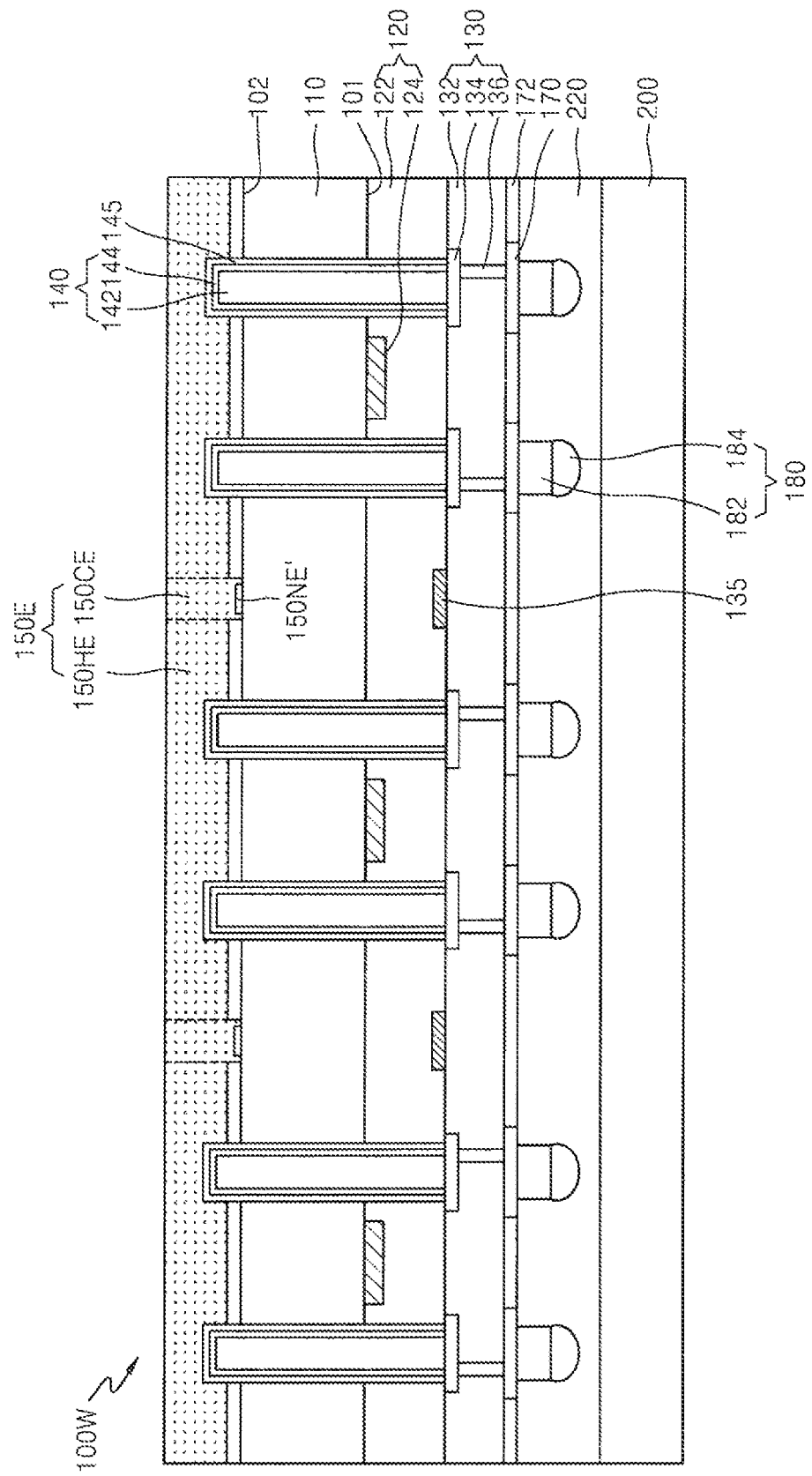
FIGS. 9A through 9D are sectional views showing a process of fabricating a semiconductor chip according to the embodiment of FIG. 4.

Referring to FIG. 9A, the polymer buffer layer 150I that covers the TSVs 140 is formed as in FIG. 6B. Next, the exposed polymer buffer layer 150E is formed via an exposure process using a PSM. The exposed polymer buffer layer 150E may include the half-exposed region 150HE and the completely-exposed region 150CE. In other words, in the present embodiment, the entirety of the polymer buffer layer 150I is at least partially exposed so that no unexposed region remains in the exposed polymer buffer layer 150E. Meanwhile, the unexposed region 150NE' for an alignment mark may be formed in the completely-exposed region 150CE.

Figure 9B:
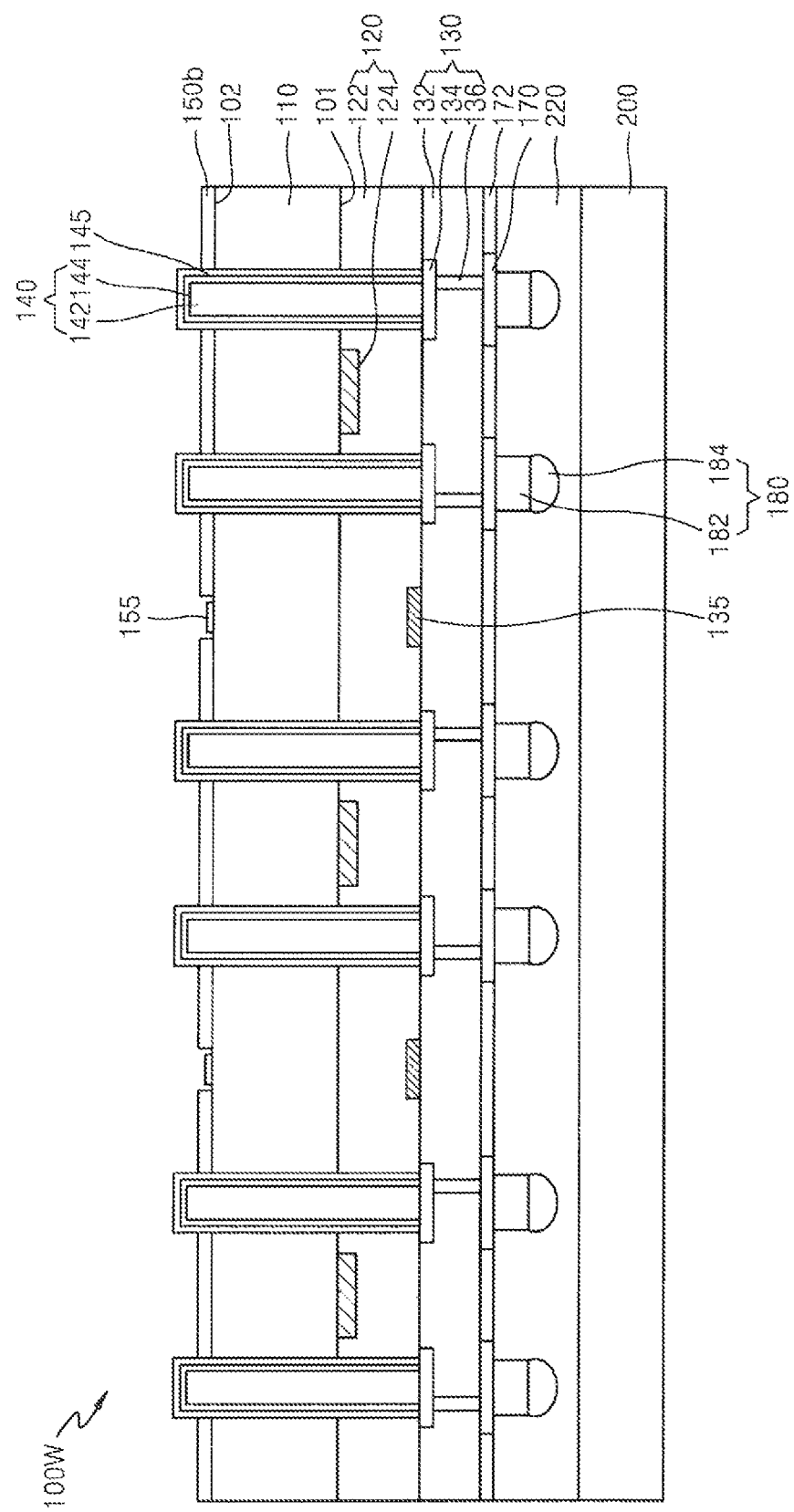

Referring to FIG. 9B, portions of the exposed polymer buffer layer 150E (i.e., the portion having chemical properties that were changed by light exposure) are removed by performing a development process. The polymer pattern layer 150*b* as shown in FIG. 4 may be formed via the development process. The completely-exposed region 150CE may correspond to the scribe lane S/L. Therefore, after the development process, the polymer align mark 155 may be formed on the scribe lane S/L.

Although the polymer pattern layer 150*b* is formed using a PSM in the present embodiment, in other embodiments the PSM may not be used. For example, the polymer pattern layer 150*b* as in the present embodiment may be formed by forming a thin polymer buffer layer, exposing only portions of the polymer buffer layer close to the align mark 155 by using a normal mask, and performing a development process.

After the development process, a curing process is performed. The polymer pattern layer 150*b* may be partially reflowed via the curing process, and thus, edges of the polymer pattern layer 150*b* may be rounded. However, since the polymer pattern layer 150*b* is formed to have a small overall thickness as shown in FIG. 9B, rounded edges of the polymer pattern layer 150*b* are not shown in detail. A cleaning process for removing unnecessarily remaining polymer may be performed after the development process and/or after the curing process.

Figure 9C:
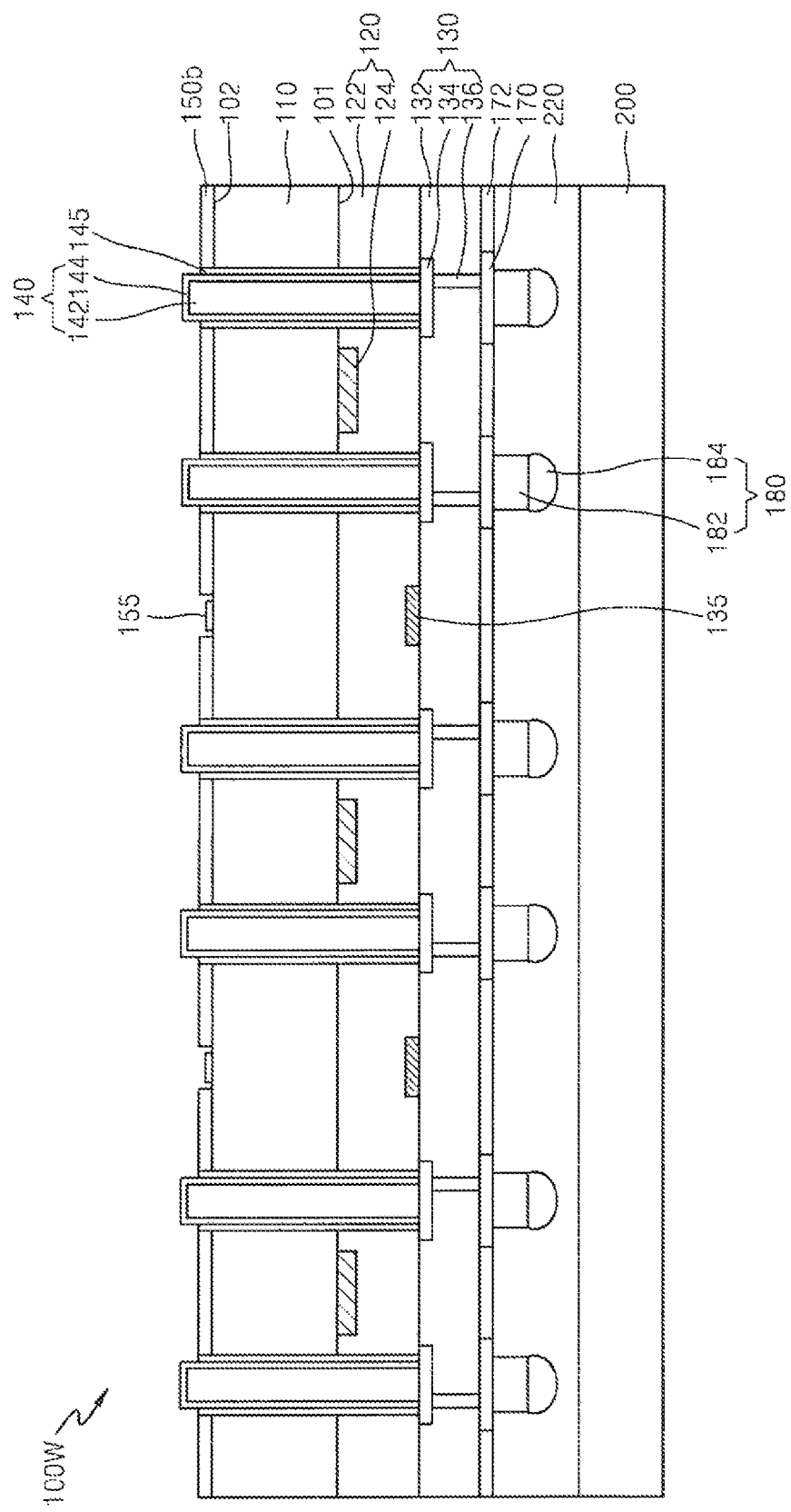

Referring to FIG. 9C, the spacer insulation layer 145, e.g., a SiO$_2$ film that surrounds the protruding TSV 140 is removed. The spacer insulation layer 145 may be removed via a dry-etching process. For example, only the spacer insulation layer 145 may be removed by adjusting etching selectivity of an etchant. As the spacer insulation layer 145 is removed, the barrier metal layer 144 may be exposed.

If necessary, the barrier metal layer 144 may be removed together with the spacer insulation layer 145 by selecting an appropriate etchant or performing an additional etching process. Furthermore, in a case where the TSVs 140 do not include the barrier metal layer 144, the wiring metal layer 142 may be exposed by the removal of the spacer insulation layer 145.

Figure 9D:
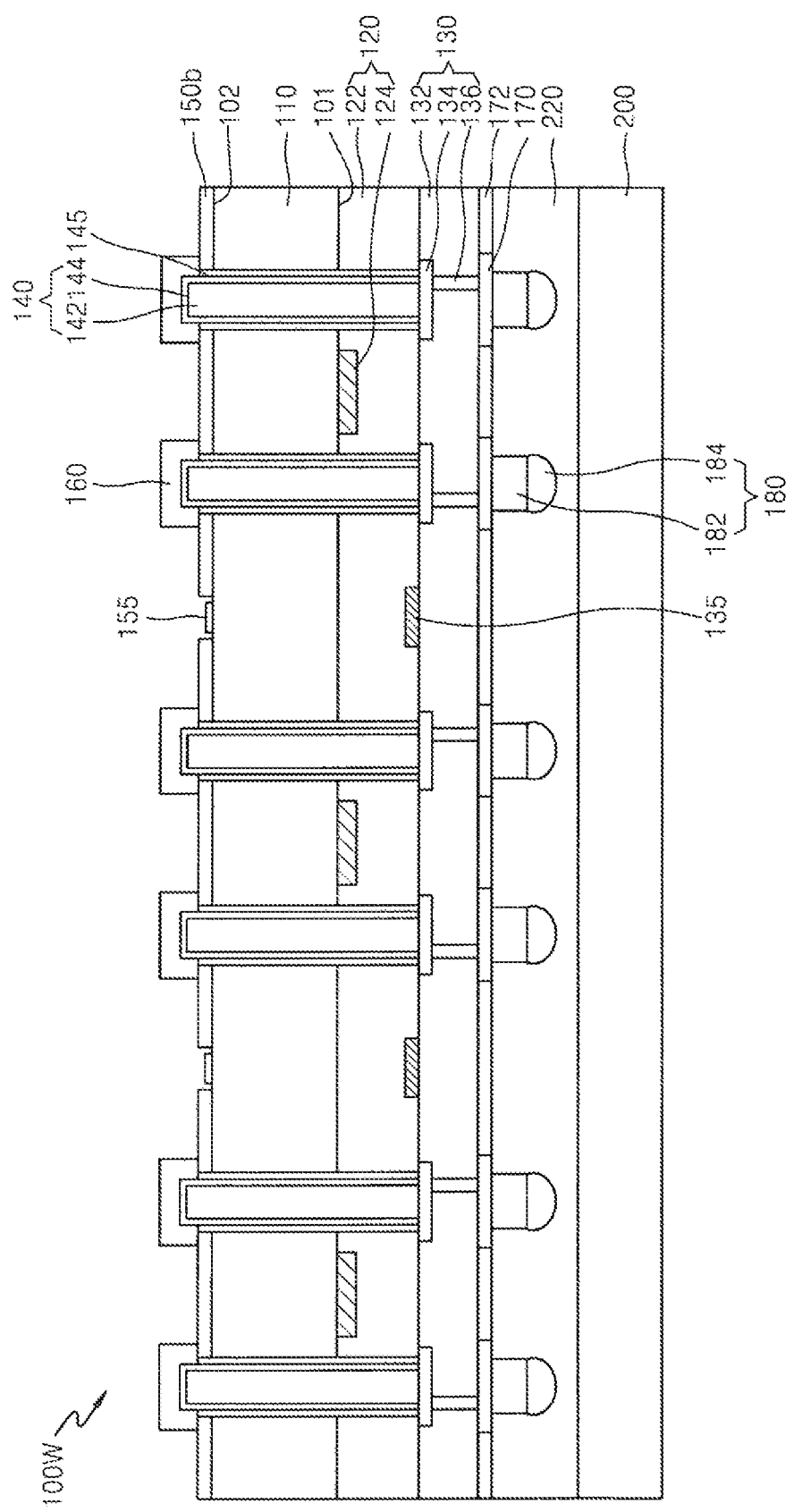

Referring to FIG. 9D, the plated pad 160 is formed by performing an electric plating process in which the exposed barrier metal layer 144 or the exposed wiring metal layer 142 is used as a seed metal. The plated pad 160 may be formed of Au, Ni/Au, Ni/Pd/Au, or Cu and may be formed to have a thickness of several microns. For example, a thickness of the plated pad 160 from the top surface of the TSV 140 may be from about 1 μm to about 3 μm.

Although not shown, a pad photo process may be performed before forming the plated pad 160. In other words, after the spacer insulation layer 145 is removed, a barrier metal (not shown), e.g., Ni or Ti/Cu, is respectively applied onto the polymer pattern layer 150 and the TSVs 140 to a thickness from about 1 μm to about 3 μm and below 1 μm, and a photoresist (PR) pattern is formed that covers portions on which the plated pads 160 are to be formed. The barrier metal is removed via an etching process using the PR pattern as a mask, and the PR pattern is removed by ashing and/or stripping. After the pad photo process, the barrier metal only remains in the portions on which the plated pads 160 are to be formed. The plated pads 160 may be formed by performing a plating process in which the remaining barrier metal is used as a seed metal.

After forming the plated pads 160, a semiconductor chip as shown in FIG. 4 may be completed by separating the wafer 100W into individual chips by sawing the wafer 100W along the scribe lanes S/L where the alignment mark 155 is formed using, for example, a laser or a blade.

FIGS. 10A through 10E are sectional views showing a process of fabricating a semiconductor chip according to the embodiment as shown in FIG. 5.

Figure 10A:
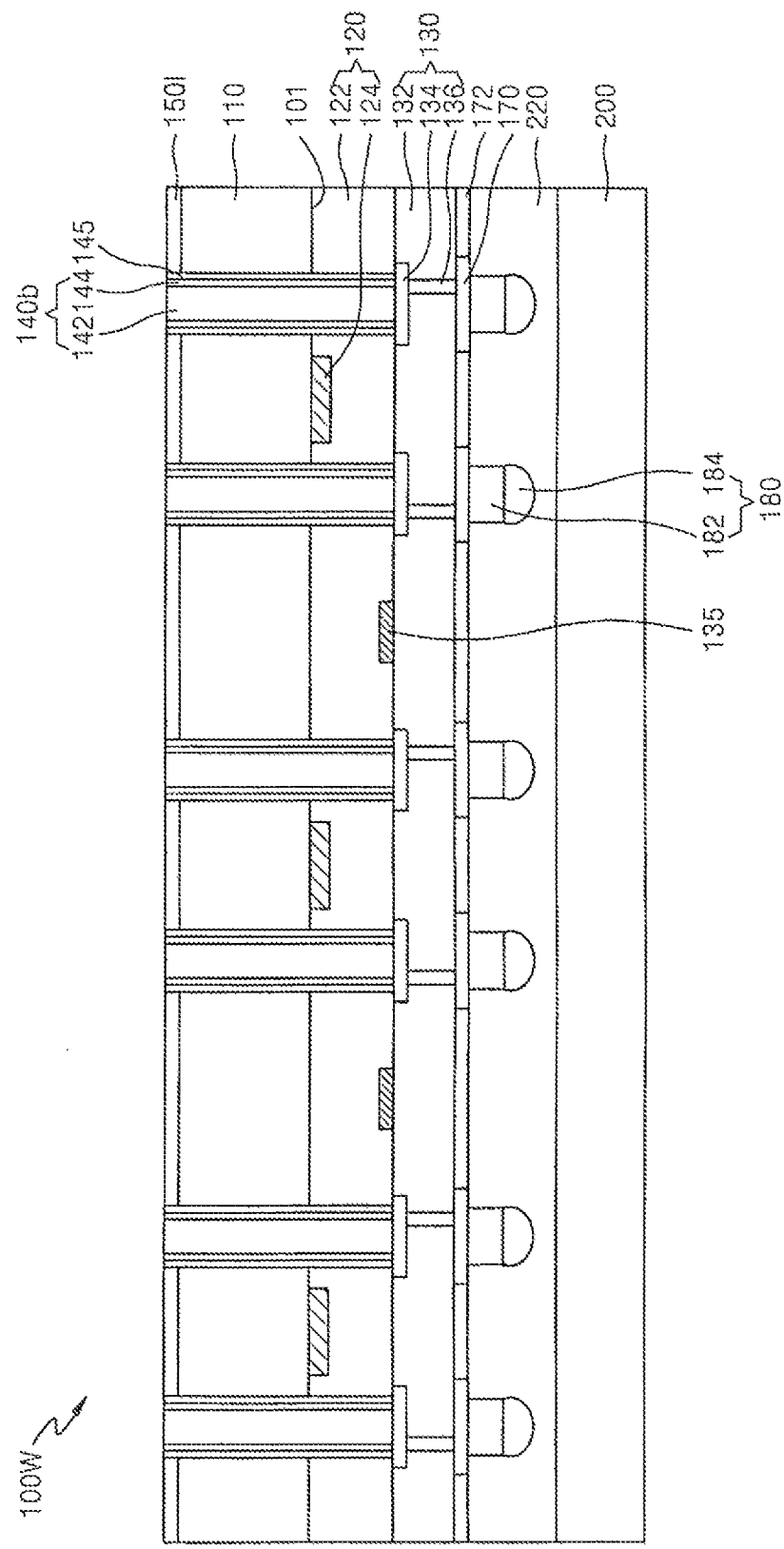
FIGS. 10A through 10E are sectional views showing a process of fabricating a semiconductor chip according to the embodiment of FIG. 5.

Referring to FIG. 10A, after the polymer buffer layer 150I is formed to cover the TSVs 140b as shown in FIG. 6B, the upper portion of the polymer buffer layer 150I is partially removed to expose the top surface of the TSVs 140b using a CMP process or the like. Via this process, the top surface of the wiring metal layer 142 may be exposed. As noted above, the polymer buffer layer 150I may be removed via CMP, isotropic etching, anisotropic etching, or a combination thereof. By removing the polymer buffer layer 150I, the spacer insulation layer 145 and the barrier metal layer 144 on the top surface of the wiring metal layer 142 may be removed.

Figure 10B:
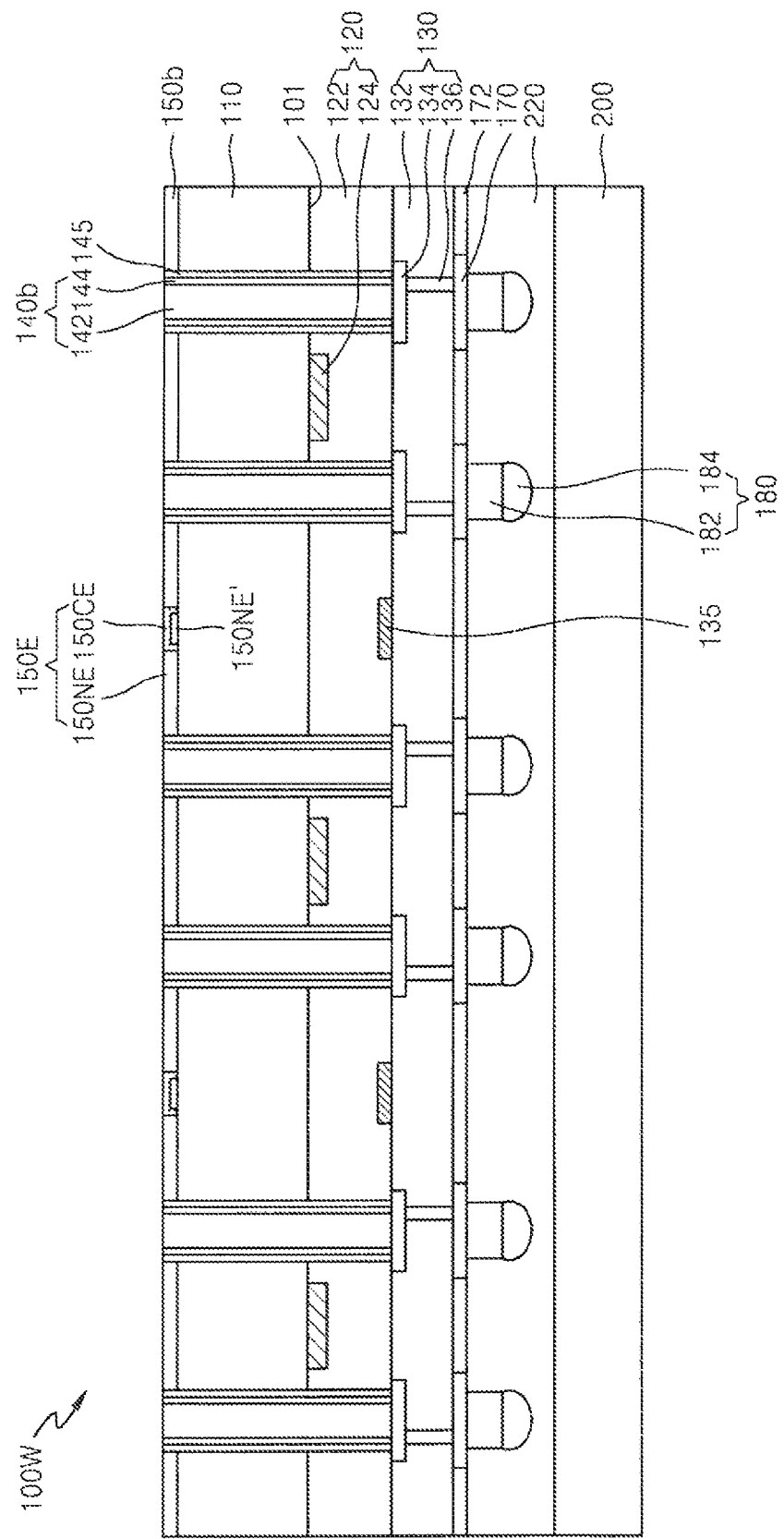

Referring to FIG. 10B, an exposure process is performed on the polymer buffer layer 150I. After the exposure process, the exposed polymer buffer layer 150E may be divided into the unexposed region 150NE and the completely-exposed region 150CE, and the unexposed region 150NE' for an align mark may be formed in the completely-exposed region 150CE. Since it is unnecessary to form a half-exposed region in the exposure process according to the present embodiment, a normal mask may be used instead of a PSM.

Figure 10C:
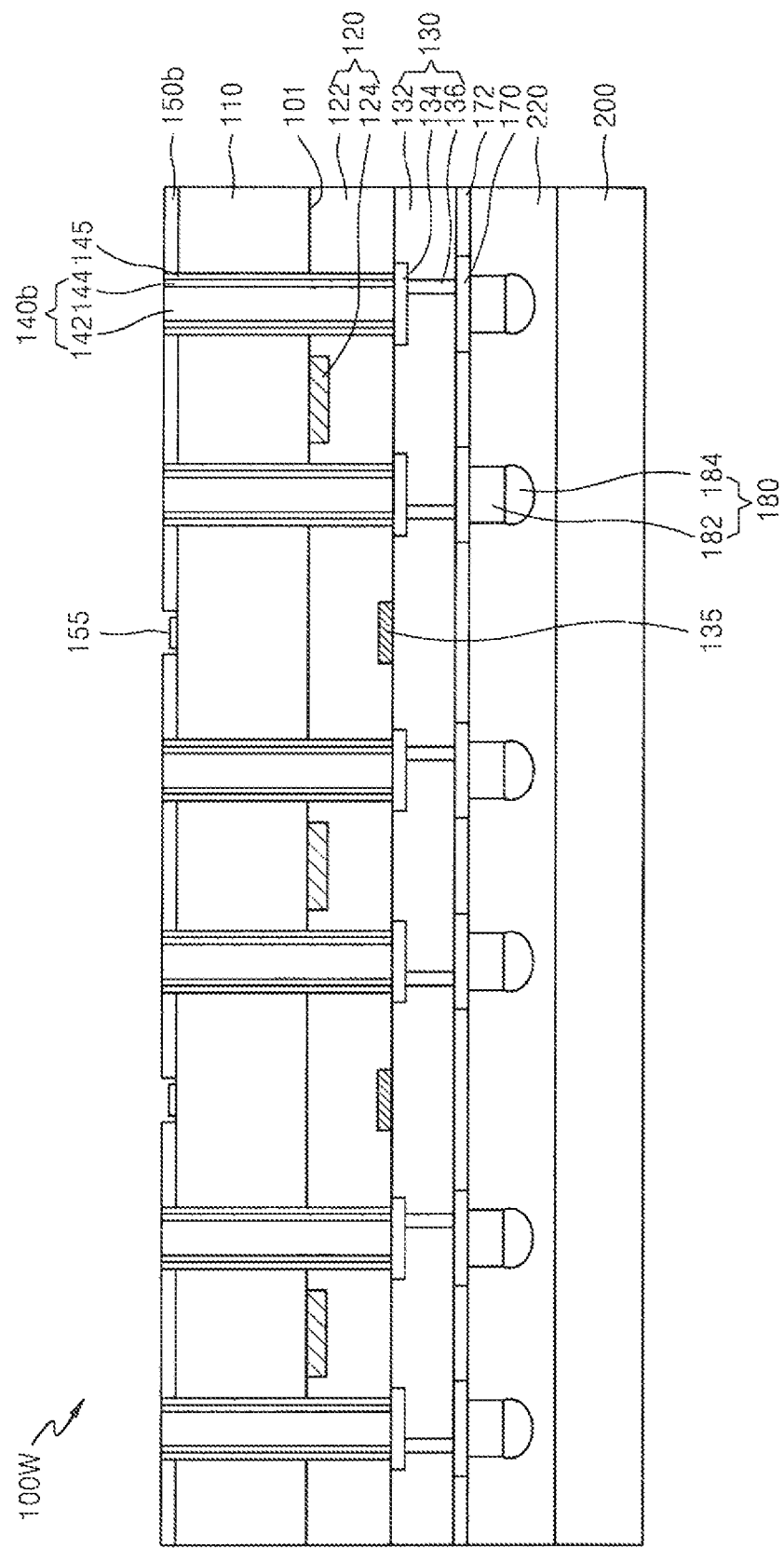

Referring to FIG. 10C, the polymer pattern layer 150b is formed via a development process. The polymer alignment mark 155 may be formed in the completely-exposed region 150CE via the development process. Meanwhile, as described above, the completely-exposed region 150CE may correspond to the scribe lane S/L region.

After the development process, a curing process is performed. The polymer pattern layer 150b may be partially reflowed in the curing process, and thus, edges of the polymer pattern layer 150b may be rounded. However, rounded edges of the polymer pattern layer 150b are not shown in detail. Meanwhile, a cleaning process for removing unnecessarily remaining polymer may be performed after the development process and/or after the curing process.

Figure 10D:
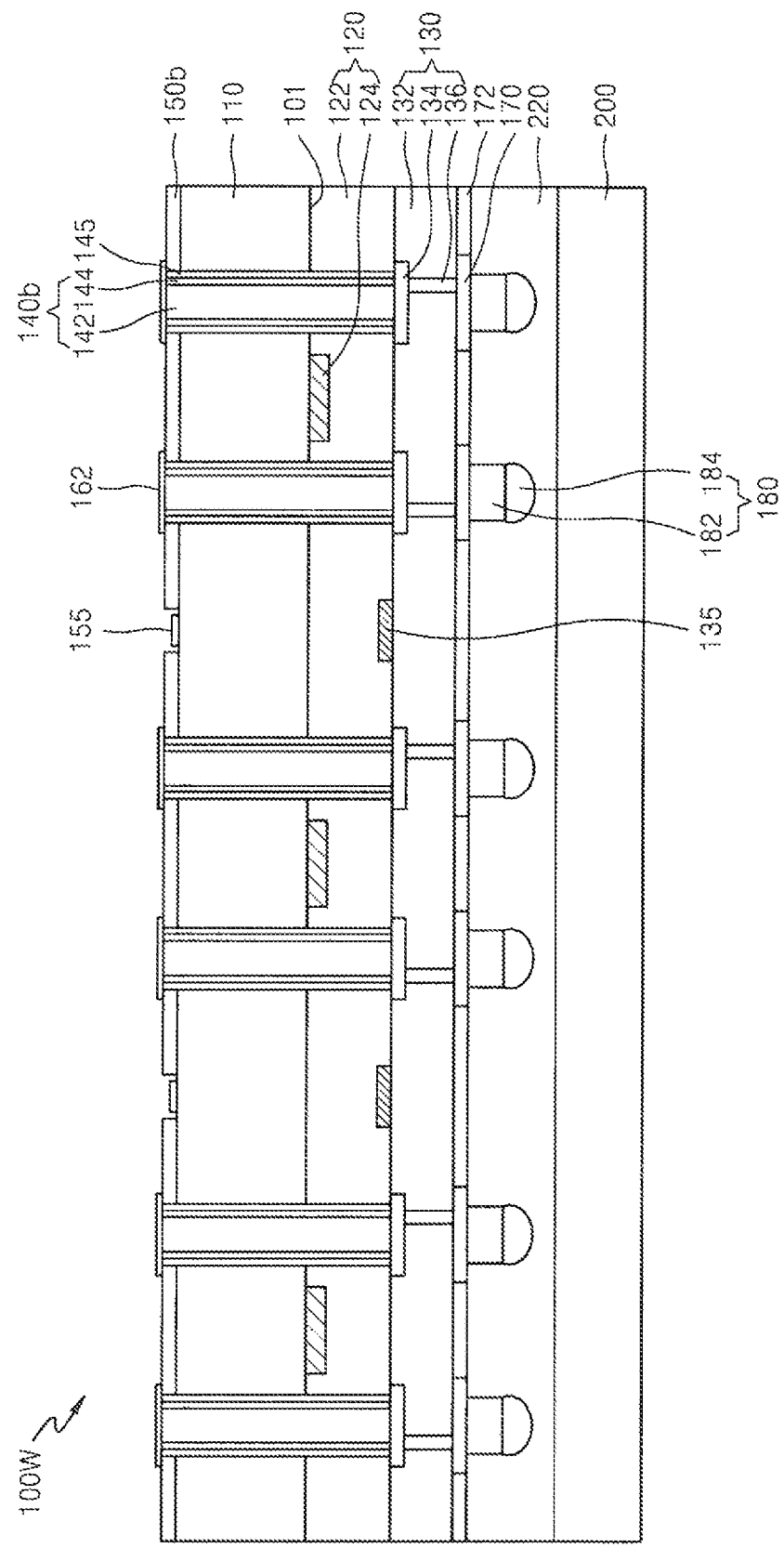

Referring to FIG. 10D, a barrier metal 162 is formed on the top surface of the TSV 140b via a pad photo process. After the barrier metal is applied on the entire top surfaces of the polymer pattern layer 150b and the TSV 140b (the full barrier metal layer is not shown in FIG. 10D), a PR pattern (not shown) is formed to cover portions on which plated pads are to be formed. The barrier metal layer is patterned via an etching process by using the PR pattern as a mask, and the PR pattern is removed by ashing and/or stripping. After the pad photo process, the barrier metal 162 only remains in the portions on which the plated pads are to be formed.

Figure 10E:
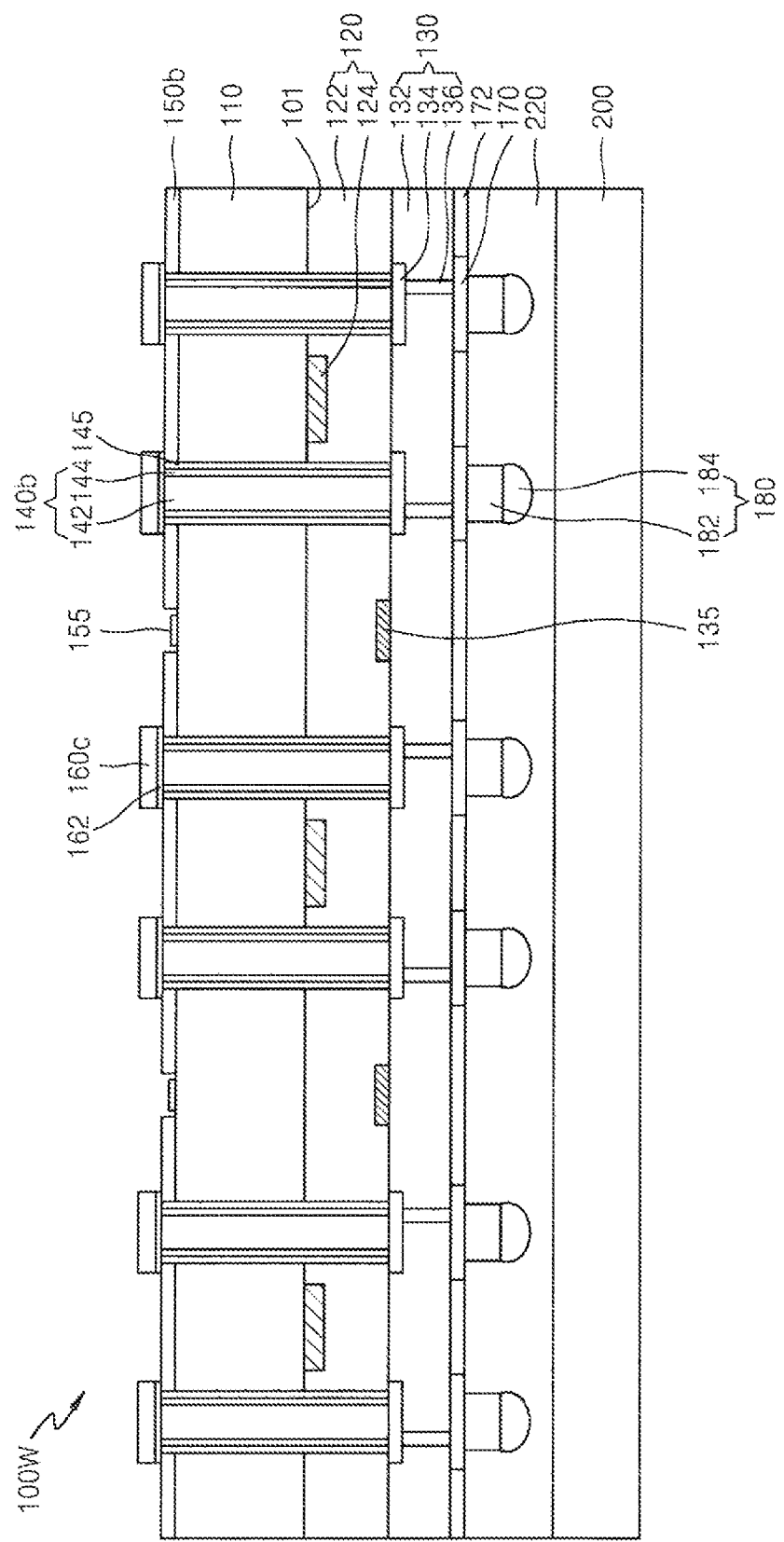

Referring to FIG. 10E, the plated pads 160c are formed via a plating process in which the barrier metal 162 is used as a seed metal. After the plated pads 160c are formed, a semiconductor chip 100d as shown in FIG. 5 may be completed by separating the wafer 100W into individual chips by sawing the wafer 100W along the scribe lane S/L using, for example, a laser or a blade. During this sawing process, the alignment mark formed at the scribe lane S/L may be removed.

Figure 11:
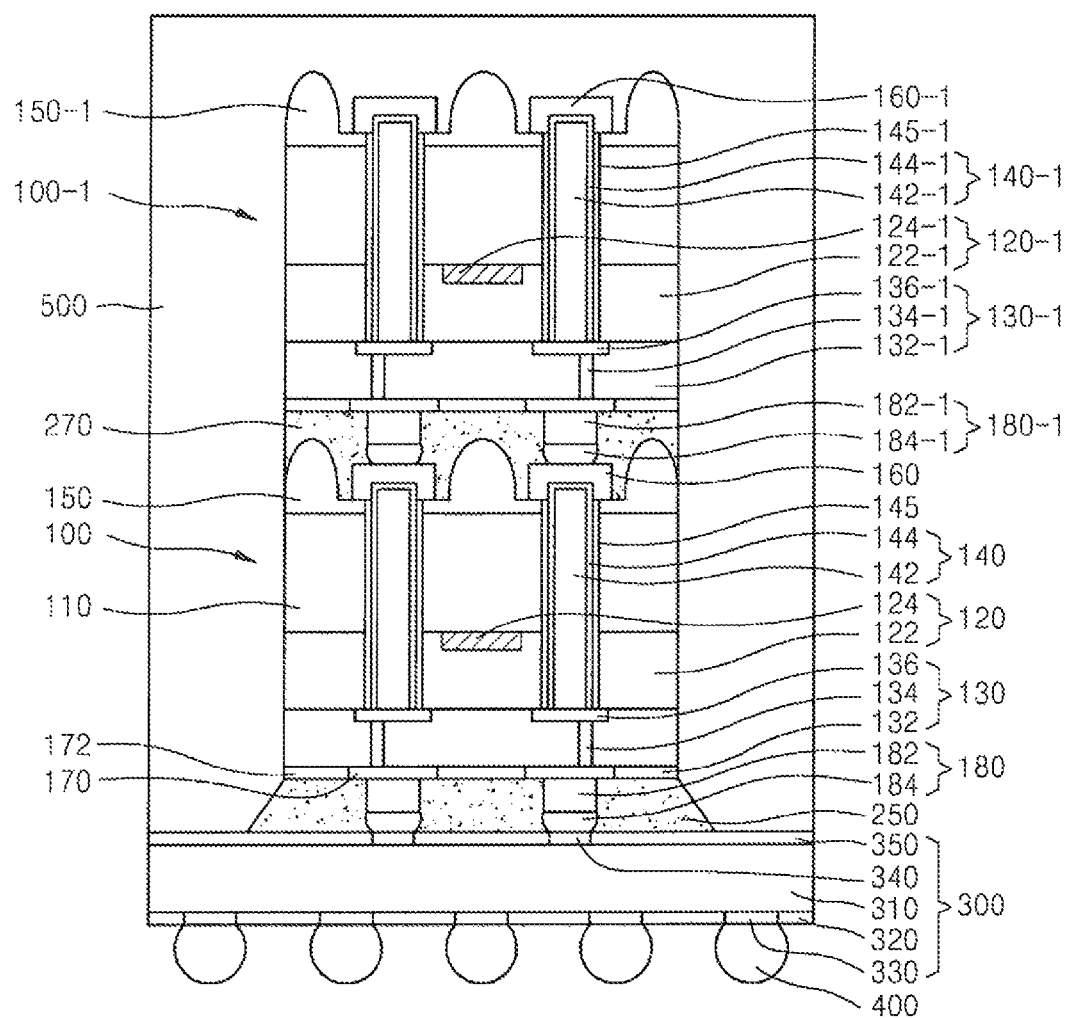
FIGS. 11 and 12 are sectional views of semiconductor packages fabricated using semiconductor chips having TSVs according to embodiments of the inventive concept.
Figure 12:
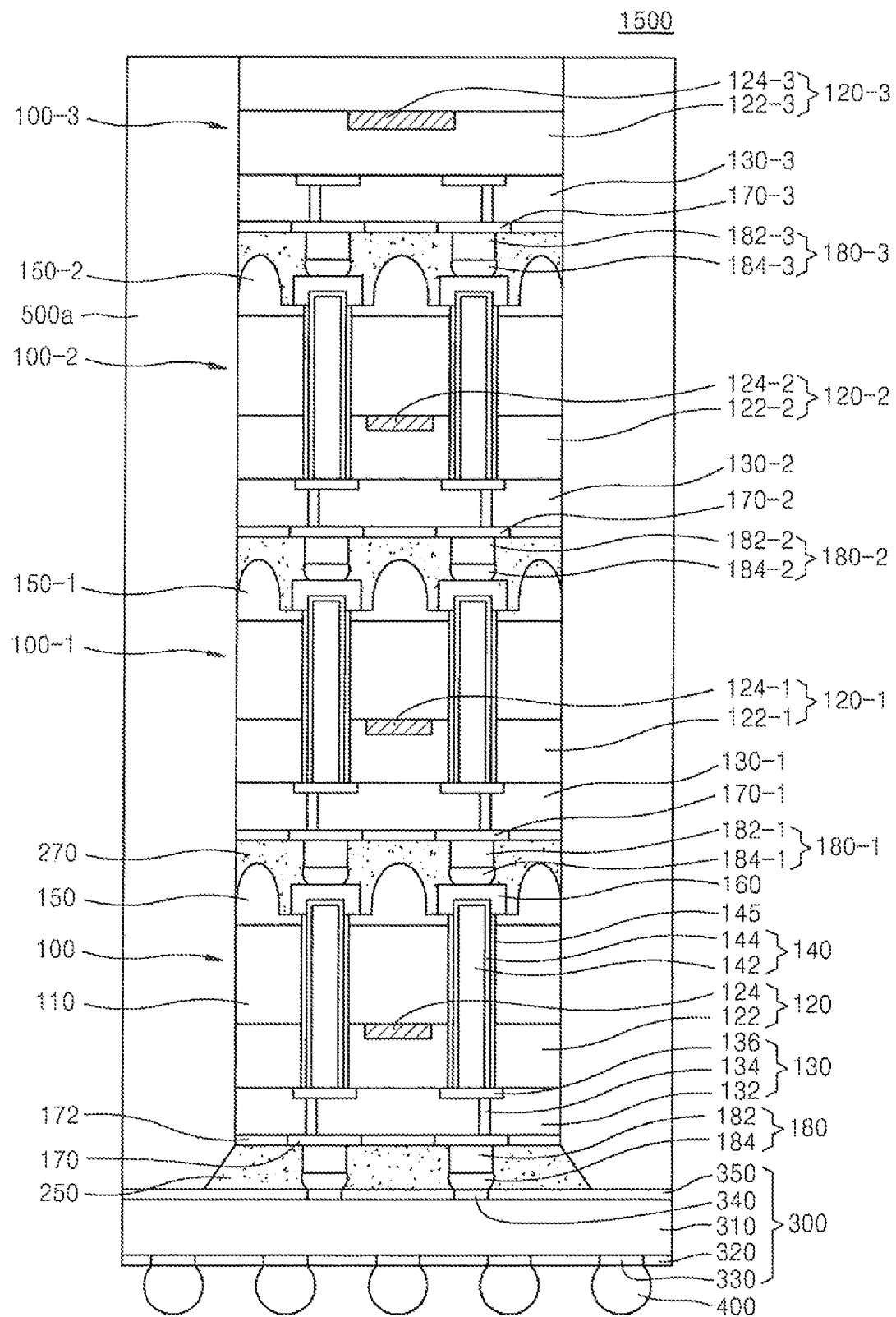

FIGS. 11 and 12 are sectional view of semiconductor packages fabricated using semiconductor chips having TSVs according to embodiments of the inventive concept.

Referring to FIG. 11, a semiconductor package 1100 according to the present embodiment may include a package substrate 300, two semiconductor chips 100 and 100-1, and a sealant 500.

The package substrate 300 may include a body layer 310, a lower protective layer 320, a lower pad 330, an upper pad 340, and an upper protective layer 350. A plurality of wirings may be formed in the body layer 310. The lower pad 330 and the upper pad 340 may be electrically connected to each other via the plurality of wirings (not shown). If necessary, a via contact (not shown) which directly interconnects the lower pad 330 and the upper pad 340 may be formed in the body layer 310.

The lower protective layer 320 and the upper protective layer 350 protect the body layer 310 and may be formed of solder resists, for example.

An external connecting member 400, e.g., a solder ball, may be formed on the lower pad 330.

The two semiconductor chips 100 and 100-1 may be stack-mounted on the package substrate 300. Each of the two semiconductor chips 100 and 100-1 may be a semiconductor chip as shown in FIG. 1. Therefore, detailed description of components thereof will be omitted.

As the connecting member 180 of the lower semiconductor chip 100 is combined with the upper pad 340 of the package substrate 300, the lower semiconductor chip 100 is stacked on the package substrate 300. Next, as a connecting member 180-1 of the upper semiconductor chip 100-1 is combined with the plated pad 160 of the lower semiconductor chip 100, the upper semiconductor chip 100-1 may be stacked on the lower semiconductor chip 100.

A space between the lower semiconductor chip 100 and the package substrate 300, that is, a space in which the connecting member 180 is connected to the upper pad 340 may be filled with an under-fill 250. The under-fill 250 may be formed of an under-fill resin, such as an epoxy resin, and may contain silica filler, flux, etc. In other embodiments, the space between the lower semiconductor chip 100 and the package substrate 300 may be filled with an adhesive instead of the under-fill 250. The adhesive may be a non-conductive film (NCF), an anisotropic conductive film (ACF), an UV film, an instant adhesive, a thermal-curing adhesive, a laser-curing adhesive, an ultrasound-curing adhesive, a non-conductive paste, etc., for example.

An adhesive 270 may be placed in a space between the upper semiconductor chip 100-1 and the lower semiconductor chip 100, that is, a space in which the connecting member 180-1 of the upper semiconductor chip 100-1 is connected to the plated pad 160 of the lower semiconductor chip 100. The adhesive 270 may be an NCF, an ACF, an UV film, an instant adhesive, a thermal-curing adhesive, a laser-curing adhesive, an ultrasound-curing adhesive, a non-conductive paste, etc. Alternatively, the space may be filled with an under-fill instead of the adhesive 270. However, the adhesive 270 may be better for reducing the size of the semiconductor package.

The sealant 500 seals the lower and upper semiconductor chips 100 and 100-1 to protect the lower and upper semiconductor chips 100 and 100-1 from physical and electrical shocks from the outside. In the present embodiment, the sealant 500 may cover side surfaces of the lower and upper semiconductor chips 100 and 100-1, side surfaces of the under-fill 250 and the adhesive 270, and the top surface of the upper semiconductor chip 100-1. The sealant 500 may be formed of a polymer, such as a resin. For example, the sealant 500 may be formed of an epoxy molding compound (EMC).

Although two identical semiconductor chips, e.g., like the semiconductor chips shown in FIG. 1, are stacked in the semiconductor package 1100, structures of the semiconductor package 1100 are not limited thereto. For example, two identical semiconductor chips as shown in any of FIGS. 1 through 5 may be stacked, or two different semiconductor chips may be stacked. Furthermore, although two semiconductor chips are stacked on the package substrate 300, the present embodiment is not limited thereto, and the semiconductor package 1100 may be formed as one semiconductor chip or three or more semiconductor chips are stacked. A structure in which four semiconductor chips are stacked is shown in FIG. 12. Meanwhile, although a TSV 140-1, a polymer pattern layer 150-1, and a plated pad 160-1 are formed in the upper semiconductor chip 100-1 of FIG. 11, since no other semiconductor chip is stacked on the upper semiconductor chip 100-1, a TSV, a polymer pattern layer, and a plated pad may not be formed in the upper semiconductor chip 100-1. Therefore, thickness of the upper semiconductor chip 100-1 may be reduced, and thus, the overall thickness of the semiconductor package 1100 may be reduced.

Referring to FIG. 12, four semiconductor chips 100, 100-1, 100-2, and 100-3 may be stacked on the package substrate 300 in a semiconductor package 1500 according to the present embodiment. The bottommost semiconductor chip 100 may be stacked on the package substrate 300 by using the under-fill 250. An adhesive may be used instead of the under-fill 250.

The second through fourth semiconductor chips 100-1, 100-2, and 100-3 from the package substrate 300 may be stacked by using the adhesive 270. An under-fill may be used instead of the adhesive 270. Meanwhile, as shown in FIG. 12, a TSV, a polymer pattern layer, and a plated pad may not be formed on the fourth semiconductor chip 100-3. Therefore, thickness of the fourth semiconductor chip 100-3 may be smaller than the thicknesses of the other semiconductor chips.

A sealant 500a may cover side surfaces of the four semiconductor chips 100, 100-1, 100-2, and 100-3 and may not cover the top surface of the fourth semiconductor chip 100-3. In other words, the top surface of the fourth semiconductor chip 100-3 may be exposed. However, if necessary, the sealant 500a may be formed to cover the top surface of the fourth semiconductor chip 100-3.

In the semiconductor package 1500 according to the present embodiment, three of the four semiconductor chips have the same structure, and the topmost semiconductor chip has different structure. However, the semiconductor package 1500 may be configured by using four semiconductor chips having the same structure. Alternatively, the semiconductor package 1500 may be configured by using four semiconductor chips having different structures from one another.

Figure 13:
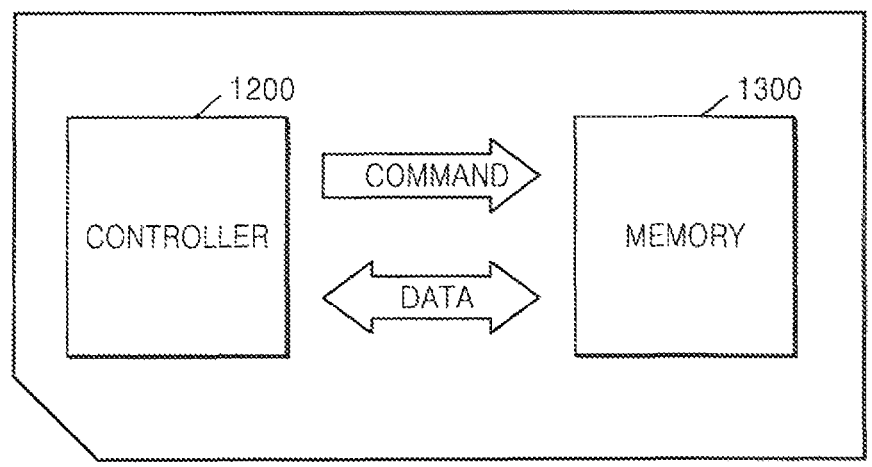
FIG. 13 is a block diagram showing a memory card including a semiconductor package according to an embodiment of the inventive concept.

FIG. 13 is a block diagram showing a memory card 1000 including a semiconductor package according to an embodiment of the inventive concept.

Referring to FIG. 13, in the memory card 1000, a controller 1200 and a memory 1300 may be arranged to exchange electrical signals. For example, if the controller 1200 issues an instruction, the memory 1300 may transmit data. The controller 1200 and/or the memory 1300 may be embodied using a semiconductor chip having a plurality of TSVs or a semiconductor package having the semiconductor chip according to any of embodiments of the inventive concept. The memory 1300 may include a memory array (not shown) or a memory array bank (not shown).

The memory card 1000 may be any of various memory cards, such as a memory stick card, a smart media card (SM), a secure digital (SD), a mini secure digital card (mini SD), and a multi media card (MMC).

Figure 14:
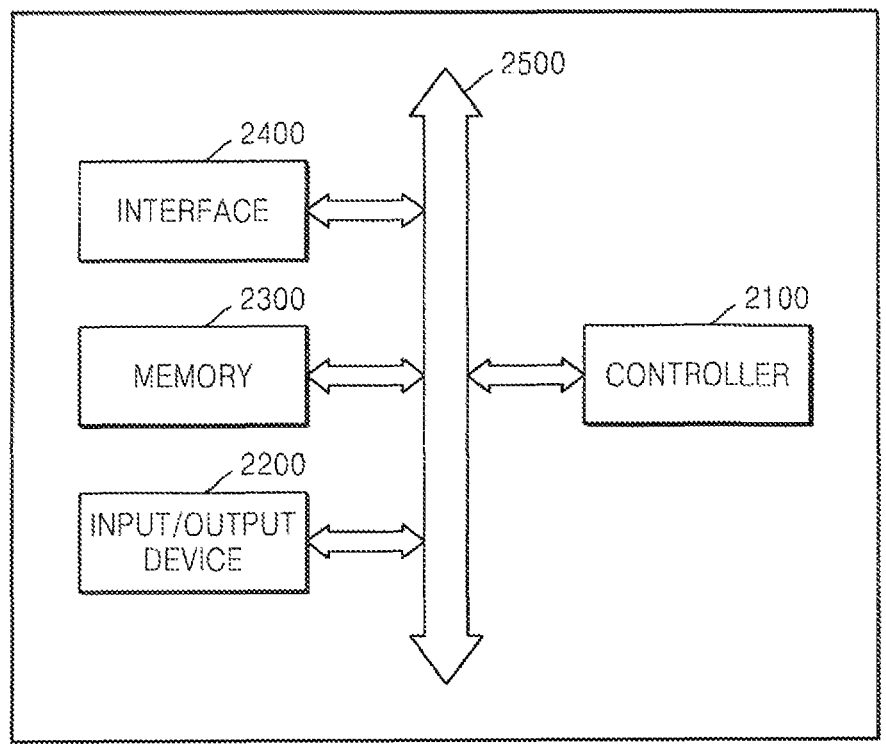
FIG. 14 is a block diagram showing an electronic system including a semiconductor package according to an embodiment of the inventive concept.

FIG. 14 is a block diagram showing an electronic system 2000 including a semiconductor package according to an embodiment of the inventive concept.

Referring to FIG. 14, the electronic system 2000 may include a controller 2100, an input/output (I/O) device 2200, a memory 2300, and an interface 2400. The electronic system 2000 may be a mobile system or a system for transmitting/receiving data. The mobile system may be, for example, a personal digital assistant (PDA), a portable computer, a web tablet, a wireless phone, a mobile phone, a digital music player, or a memory card.

The controller 2100 may execute various programs and control the electronic system 2000. The controller 2100 may be, for example, a microprocessor, a digital signal processor, a microcontroller, or the like. The I/O device 2200 may be used for inputting and outputting data to/from the electronic system 2000.

The electronic system 2000 may be connected to an external device, e.g., a personal computer or a network, via the I/O device 2200 and exchange data with the external device. The I/O device 2200 may be, for example, a keypad, a keyboard, or a display device. The memory 2300 may store codes/data for operating the controller 2100 or data processed by the controller 2100. The controller 2100 and/or the memory 2300 may be embodied by using a semiconductor chip having a plurality of TSVs or a semiconductor package having the semiconductor chip according to any of embodiments of the inventive concept. The interface 2400 may be a data transmission path between the electronic system 2000 and an external device. The controller 2100, the I/O device 2200, the memory 2300, and the interface 2400 may communicate with each others via a bus 2500.

For example, the electronic system 2000 may be used in a mobile phone, an MP3 player, a navigation device, a portable multimedia player (PMP), a solid state disk (SSD), or household appliances.

While the inventive concept has been particularly shown and described with reference to exemplary embodiments thereof, it will be understood that various changes in form and details may be made therein without departing from the spirit and scope of the following claims.

What is claimed is:

1. A method of fabricating a semiconductor chip, the method comprising:
    forming a plurality of through silicon vias (TSV) in a substrate that has a first surface and an opposed second surface;
    recessing the second surface of the substrate so that each TSV includes a protruding region that protrudes above the second surface of the substrate;
    forming a polymer buffer layer that covers the protruding regions of the TSVs;
    performing an exposure process using a phase shift mask (PSM) on the polymer buffer layer to form a polymer pattern layer that includes a completely-exposed region that is completely exposed to light during the exposure process so that the chemical properties of the completely exposed region are changed throughout the completely exposed region and a half-exposed region that is partially exposed to light during the exposure process so that the chemical properties of only a portion of the half exposed region are changed;
    performing a development process on the polymer pattern layer to remove portions of the polymer pattern layer whose chemical properties were changed during the exposure process; and
    forming a plated pad on the TSVs via an electroplating process after removing the upper portion of the polymer pattern layer so that the top surfaces of the TSVs are exposed through the polymer pattern layer,
    wherein an alignment mark is formed in the completely-exposed region of the polymer pattern layer.

2. The method of claim 1, further comprising curing the polymer pattern layer after the polymer pattern layer is formed.

3. The method of claim 1, wherein art insulation layer is formed on the top surface and the side surfaces of the TSVs, and
    a portion of the insulation layer on the protruding region of each of the TSVs is removed before the electroplating process is performed.

4. The method of claim 1, wherein the TSVs protrude above the half-exposed region of the polymer pattern layer, wherein the completely-exposed region corresponds to a scribe lane.

5. The method of claim 1, wherein a plurality of micro-bumps that are electrically connected to respective ones of the TSVs are formed on the first surface of the substrate, further comprising adhering the first surface of the substrate, on which the micro-bumps are arranged, to a supporting substrate by using an adhesive before recessing of the second surface of the substrate.

6. The method of claim 1, further comprising:
    forming a barrier metal layer on the whole surface of the substrate before the plated pad is formed on the TSVs;
    forming a photoresist pattern covering a portion on which the plated pad is to be formed; and
    etching the barrier metal layer using the photoresist pattern as a mask.

7. The method of claim 1, wherein the PSM includes a first region in which only a quartz layer exists, a second region in which a MoSiON layer and a Cr layer exist on the quartz layer, and a third region in which only the MoSiON layer exists on the quartz layer, and
    the completely-exposed region corresponds to the first region, and the half-exposed region corresponds to the third region.

8. The method of claim 1, wherein at least two TSVs are disposed in a single half-exposed region.

9. The method of claim 1, wherein the polymer pattern layer includes an unexposed region between two of the half-exposed regions or between the completely-exposed region and the half-exposed region.

10. The method of claim 2, wherein the polymer pattern layer is partially reflowed via the curing the polymer pattern layer.

11. The method of claim 4, wherein the alignment mark is formed without a chemical mechanical polishing (CMP) process.

12. A method of fabricating a semiconductor chip, the method comprising:
    forming a plurality of through silicon vias (TSVs) in a substrate that has a first surface and an opposed second surface, wherein an insulation layer is formed on ton surfaces and side surfaces of the TSVs;
    recessing the second surface of the substrate so that each TSV includes a protruding region that protrudes above the second surface of the substrate;
    forming a polymer buffer layer that covers the protruding regions of the TSVs;
    removing an upper portion of the polymer buffer layer so that top surfaces of the TSVs are exposed by;
    performing an exposure process using a phase shift mask (PSM) on the polymer buffer layer to form a polymer pattern layer that includes a completely-exposed region that is completely exposed to light during the exposure process so that the chemical properties of the completely-exposed region are changed throughout the completely-exposed region and a half-exposed region that is partially exposed to light during the exposure process so that the chemical properties of only a portion of the half exposed region are changed;
    performing a development process on the polymer pattern layer to remove the selected portions of the polymer pattern layer;
    removing portions of the insulation layer on the protruding region of each of the TSVs that are exposed after the selected portions of the polymer pattern layer are removed; and
    forming a plated pad on the TSVs via an electroplating process after removing the upper portion of the polymer buffer layer so that the top surfaces of the TSVs are exposed through the polymer pattern layer,
    wherein the selected portions of the polymer pattern layer that are removed by the development process comprise either portions whose chemical properties were changed during the exposure process or portions whose chemical properties were not changed during the exposure process.

13. The method of claim 12, wherein each TSV includes a wiring metal layer and a barrier metal layer surrounding the wiring metal layer, and
in removing the upper portion of the polymer buffer layer, the wiring metal layer of each TSV is exposed.

14. The method of claim 12, wherein removing the upper portion of the polymer buffer layer is performed via a chemical mechanical polishing (CMP) process.

15. The method of claim 12, wherein an alignment mark is formed in the completely-exposed region of the polymer pattern layer, and the completely-exposed region corresponds to a scribe lane.

16. The method of claim 12, wherein the forming a plated pad on the TSVs includes forming a barrier metal via a pad photo process.

17. The method of claim 12, wherein a width of a plated pad is wider than or equal to a width of the TSV.

18. A method of fabricating a semiconductor chip, the method comprising:
forming a plurality of through silicon vias (TSV) in a substrate;
recessing the substrate so that a region of each TSV protrudes above the second surface of the substrate;
forming a polymer buffer layer that covers the protruding regions of the TSVs;
performing an exposure process using a phase shift mask (PSM) on the polymer buffer layer to convert the polymer buffer layer into a polymer pattern layer that includes at least a completely-exposed region and a half-exposed region that have chemical properties that were changed during the exposure process;
forming a plated pad on the TSVs and on the polymer pattern layer via an electroplating process; and
performing a development process on the polymer pattern layer to remove selected portions of the polymer pattern layer,
curing the polymer pattern layer after performing the development process,
wherein the TSVs protrude above the half-exposed region of the polymer pattern layer, and
wherein an alignment mark is formed in the completely-exposed region of the polymer pattern layer, and the completely-exposed region corresponds to a scribe lane,
wherein the polymer pattern layer is partially reflowed during the curing process.

19. The method of claim 18, wherein the selected portions of the polymer pattern layer that are removed by the development process comprise either portions whose chemical properties were changed during the exposure process or portions whose chemical properties were not changed during the exposure process.

* * * * *